(12) United States Patent
Takahashi

(10) Patent No.: US 8,279,983 B2
(45) Date of Patent: Oct. 2, 2012

(54) AUTOMATIC GAIN CONTROL APPARATUS

(75) Inventor: Katsuyuki Takahashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 947 days.

(21) Appl. No.: 12/227,799

(22) PCT Filed: Feb. 28, 2007

(86) PCT No.: PCT/JP2007/053727
§ 371 (c)(1),
(2), (4) Date: Nov. 26, 2008

(87) PCT Pub. No.: WO2007/138769
PCT Pub. Date: Dec. 6, 2007

(65) Prior Publication Data
US 2009/0092207 A1    Apr. 9, 2009

(30) Foreign Application Priority Data
May 30, 2006    (JP) .................................. 2006-150398

(51) Int. Cl.
*H04L 27/08*    (2006.01)
(52) U.S. Cl. ...................................................... 375/345
(58) Field of Classification Search .................. 375/147, 375/232, 260, 345, 355, 375, 376
See application file for complete search history.

(56) References Cited

U.S. PATENT DOCUMENTS

| 5,452,332 A * | 9/1995 | Otani et al. ................ 375/345 |
| 6,094,489 A * | 7/2000 | Ishige et al. ................ 381/60 |
| 6,477,358 B1 | 11/2002 | Mader et al. |
| 2007/0296500 A1 * | 12/2007 | Yang ............................ 330/278 |

FOREIGN PATENT DOCUMENTS

| JP | 9-266422 | 10/1997 |
| JP | 09266422 A * | 10/1997 |
| JP | 10-303666 | 11/1998 |
| JP | 10303666 A * | 11/1998 |
| JP | 2001-508620 | 6/2001 |
| JP | 2003-283278 | 10/2003 |
| JP | 2003283278 A * | 10/2003 |
| JP | 2004-080610 | 3/2004 |

* cited by examiner

*Primary Examiner* — David C. Payne
*Assistant Examiner* — Syed Haider
(74) *Attorney, Agent, or Firm* — Rabin & Berdo, P.C.

(57) ABSTRACT

An automatic gain control apparatus can prevent jumps in the gain coefficient when the gain coefficient is altered, due to a sharp change in the level of the received signal before and after the alteration. The apparatus includes a mean square circuit for processing the received signal, a gain coefficient generating circuit for generating a gain coefficient, a decision circuit for deciding whether the received level of the received signal has changed, and a control circuit for, when a change in the received level of the received signal is detected, determining a number of mean square values and a generating interval. The apparatus further includes a gain coefficient linear smoother for altering the gain coefficient over an interval, and a multiplier for multiplying the received signal by the gain coefficient obtained from the gain coefficient linear smoother.

2 Claims, 31 Drawing Sheets

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

GAIN COEFFICIENT INCREASED

GAIN COEFFICIENT DECREASED

AUTOMATIC GAIN CONTROL APPARATUS

TECHNICAL FIELD

The present invention relates to an automatic gain control apparatus. The invention can be employed in, for example, an automatic gain control apparatus that uses a prescribed gain coefficient to output a received signal at a constant level.

BACKGROUND ART

Art related to an automatic gain control apparatus that sets a gain coefficient automatically according to the received level of a signal and outputs the signal at a constant level is disclosed in Patent Document 1. The conventional apparatus disclosed in this document enables the gain coefficient to be calculated with high trackability of changes in the received level by employing a function that alters the number of samples used to calculate the gain coefficient according to the received level.

The operation of the above conventional apparatus will be briefly described below with reference to FIGS. 2 and 3. FIG. 2 is a block diagram showing the structure of the conventional automatic gain control apparatus; FIG. 3 is a flowchart illustrating the basic operation of the conventional automatic gain control apparatus.

As shown in FIG. 2, the conventional automatic gain control apparatus 100 comprises a mean square circuit 1, a memory 2, a gain coefficient generating circuit 3, a multiplier 4, a decision circuit 5, a control circuit 6, and a table ROM 7.

The automatic gain control apparatus 100 processes a received signal as an input signal $x(t)$ (step S1); a gain coefficient Ag is applied to the input signal $x(t)$ (step S2); and an amplified $z(t)$ ($=Ag \times \{x(t)\}$) is output from the multiplier 4 as the output signal (step S3).

The output signal $z(t)$ from the multiplier 4 is simultaneously input to a feedback loop (it is input to the mean square circuit 1).

In the mean square circuit 1, the output signal $z(t)$ from the multiplier 4 is squared one sample at a time, a sample being the processing unit (step S4), and the calculated results are stored in the memory 2. The processes in steps S2 and S4 are repeated n times until the sample count unit n is reached (steps S5 and S6), after which the mean square circuit 1 calculates the mean square value $Ave(j)$ (step S7) and records the mean square value $Ave(j)$ in the memory 2 (step S8).

The operations in steps S2 and S4-S7 are repeated N times (step S9), and the gain coefficient generating circuit 3 calculates the mean value Vr of the N mean square values $Ave(j)$ (step S10). The gain coefficient Ag is obtained by dividing a preset reference level Lv by the mean value Vr thus obtained (step S11), and the gain coefficient is altered to this value.

Simultaneously with the calculation of the gain coefficient, the decision circuit 5 monitors changes in the level (step S12), and if there is a change of a predetermined magnitude, the control circuit 6 performs control to change the number N of mean square values needed to obtain the gain coefficient or the interval at which the gain coefficient is altered (step S13). The control circuit 6 makes these changes on the basis of information stored in the table ROM 7, to which the control circuit 6 refers.

As described above, the conventional automatic gain control apparatus 100 alters the gain coefficient and performs gain control according to changes in the received level of the signal.

Patent Document 1: Japanese Patent Application Publication No. 2003-283278

DISCLOSURE OF THE INVENTION

Problems to be Solved by the Invention

As shown in FIGS. 4A and 4B, however, when the above conventional automatic gain control apparatus alters the gain coefficient Ag according to a change in the received level of the signal, there is a lack of connectivity in the gain coefficients before and after the alteration, and a steep jump GA may occur in the gain coefficient.

A problem has been that if the automatic gain control apparatus is used for gain control of an audio signal level, for example, when a sudden change occurs in the sound level before and after the alteration of the gain coefficient Ag, the user of the apparatus experiences a strange acoustic sensation.

It is therefore an object of the present invention to provide an automatic gain control apparatus that can prevent jumps in the gain coefficient when the gain coefficient is altered due, e.g., to a sharp change in the received level of the signal before and after the alteration.

Means of Solving the Problems

In an automatic gain control apparatus for applying gain to a received signal to control the signal level, the present invention comprises: a mean square processing means for performing mean square processing on the received signal over prescribed sampling intervals; a memory means for storing mean square values obtained by the mean square processing means; a gain coefficient generating means for generating a gain coefficient by dividing a preset reference output level by a mean value of a predetermined number of the mean square values stored in the memory means, at predetermined generating intervals; a decision means for deciding whether the received level of the received signal has changed; a gain coefficient generation control means for, when a change in the received level of the received signal is detected by the decision means, determining the number of mean square values to be used in the generating of the gain coefficient by the gain coefficient generating means, and the generating interval; a gain coefficient alteration control means for altering the gain coefficient over an interval between the gain coefficient received from the gain coefficient generating means before an alteration and the gain coefficient received from the gain coefficient generating means after the alteration linearly and/or nonlinearly with a predetermined characteristic; and a multiplying means for multiplying the received signal by the gain coefficient received from the gain coefficient alteration control means.

Effect of the Invention

According to the present invention, when the gain coefficient is altered, a jump in the gain coefficient due to, say, a sharp level change in the received level before and after the alteration can be prevented.

DESCRIPTION OF REFERENCE NUMERALS

Figure 1:
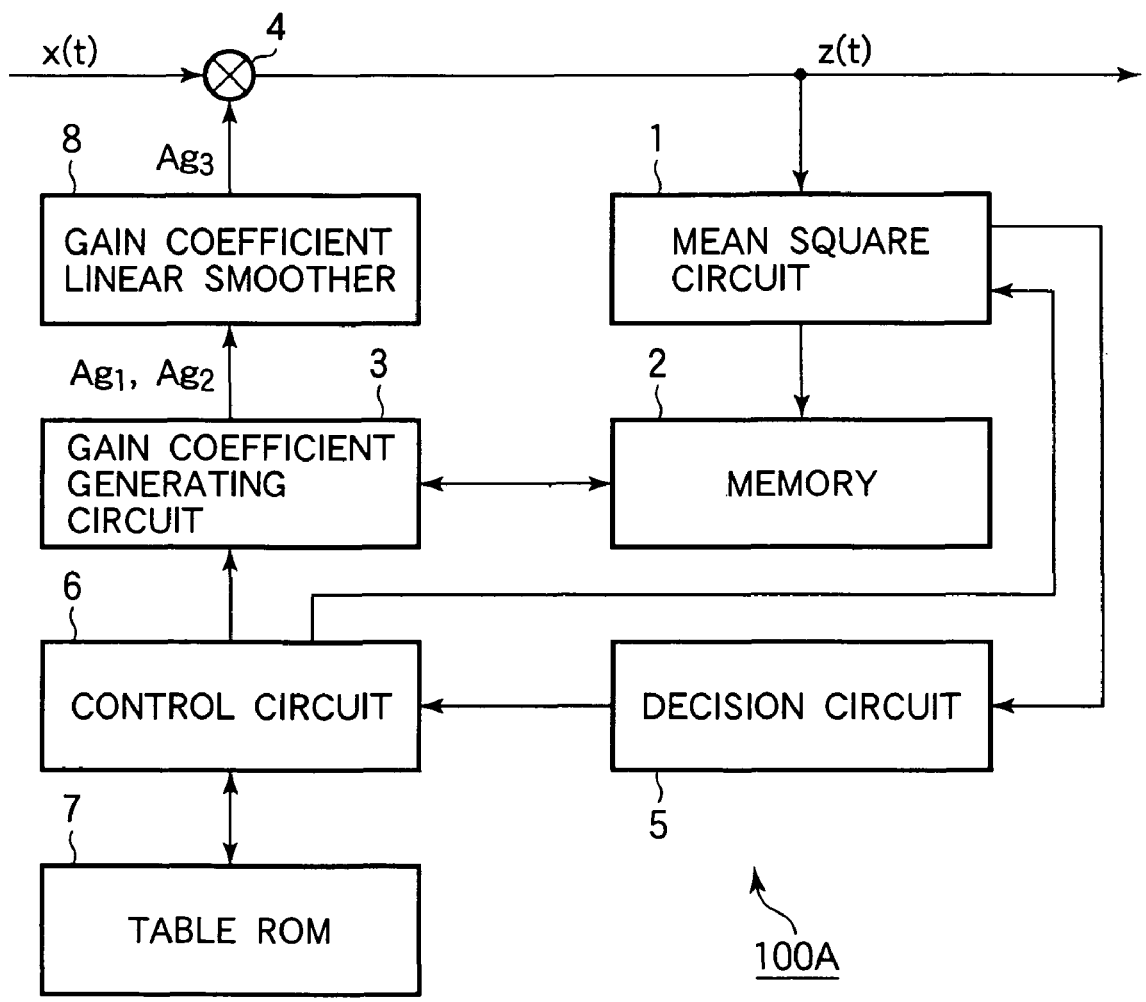
FIG. 1 is a block diagram showing the structure of an automatic gain control apparatus in a first embodiment of the present invention.

100, 100A-100G . . . automatic gain control apparatus
1 . . . mean square circuit
2 . . . memory
3 . . . gain coefficient generating circuit
4 . . . multiplier
5 . . . decision circuit
6 . . . control circuit
7 . . . table ROM
8 . . . gain coefficient linear smoother
9 . . . gain coefficient nonlinear smoother
14 . . . gain coefficient smoother
15 . . . smoothing time adjuster

BEST MODE FOR CARRYING OUT THE INVENTION (A) First Embodiment

An automatic gain control apparatus according to a first embodiment of the invention will be described below with reference to the attached drawings.

The first embodiment will be described as being used in a device that employs the inventive automatic gain control apparatus to control the gain of an audio signal. In the first embodiment, it is possible to provide an automatic gain control apparatus that can prevent jumps in the gain coefficient, eliminate strange acoustic sensations, and assure excellent audio quality.

(A-1) Structure of the First Embodiment

FIG. 1 is a block diagram showing the structure of an automatic gain control apparatus according to the first embodiment. As shown in FIG. 1, the automatic gain control apparatus 100A comprises a mean square circuit 1, a memory 2, a gain coefficient generating circuit 3, a multiplier 4, a decision circuit 5, a control circuit 6, a table ROM 7, and a gain coefficient linear smoother 8.

Figure 2:
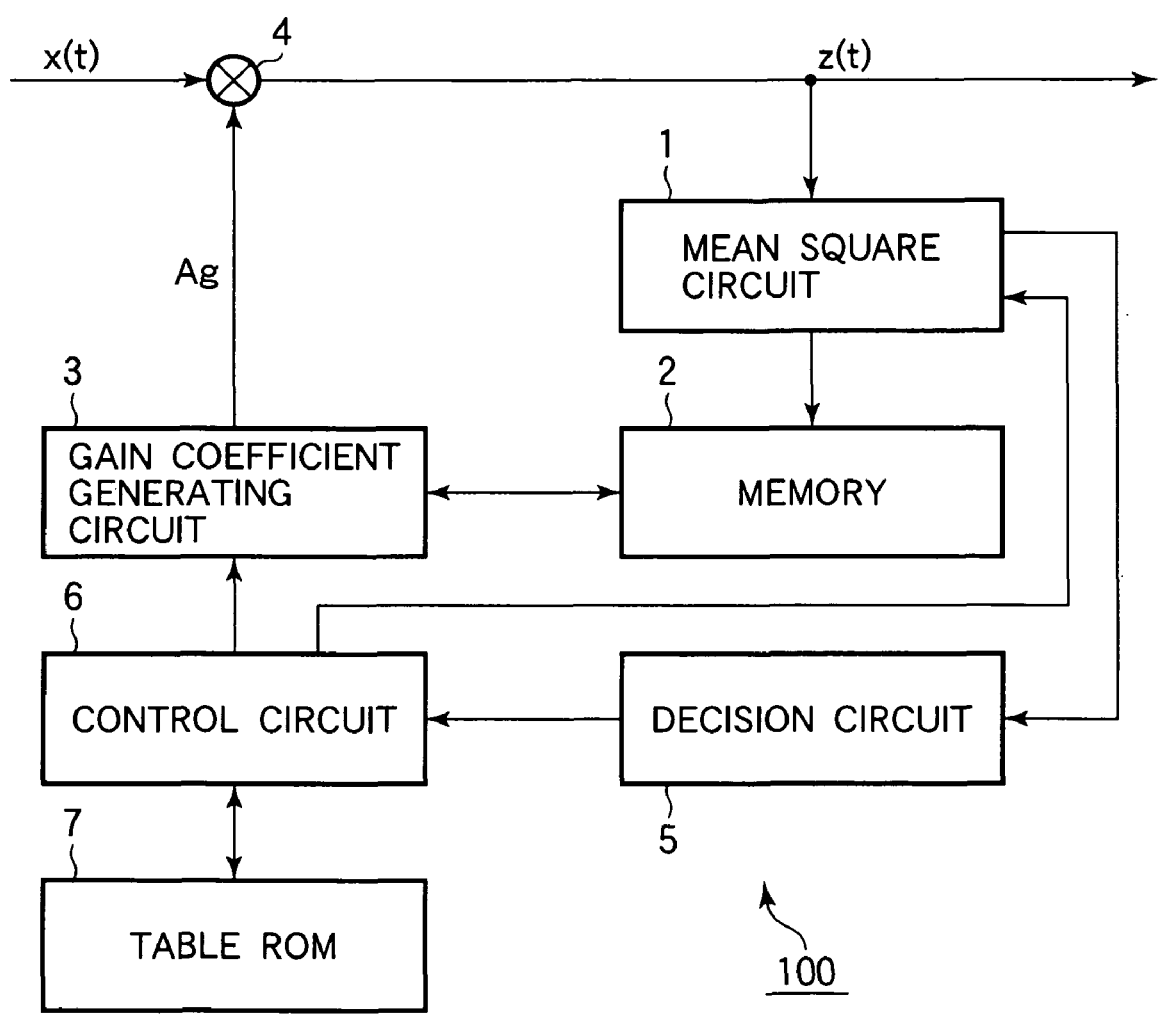
FIG. 2 is a block diagram showing the structure of a conventional automatic gain control apparatus.

In addition to the constituent elements of the conventional automatic gain control apparatus 100 shown in FIG. 2, the automatic gain control apparatus 100A has a gain coefficient linear smoother 8. Constituent elements that are identical to or correspond to constituent elements of the conventional automatic gain control apparatus 100 are given the same reference characters in FIG. 1.

The multiplier 4 receives a signal x(t) as an input signal, applies a gain coefficient $AG_3$ to the input signal x(t), and outputs z(t) with an amplified signal level. When this signal z(t) is output as an output signal, it is simultaneously input to the mean square circuit 1 (that is, it is input to a feedback loop). The gain coefficient $AG_3$ that the multiplier 4 applies to the input signal x(t) is supplied by the gain coefficient linear smoother 8, and can be altered by the method described below.

The mean square circuit 1 receives the signal z(t) output from the multiplier 4 as an input signal, and performs a mean square process over a predetermined n-sample interval. That is, the mean square circuit 1 squares each sample z(i) of the input signal z(t), and calculates the mean square value Ave(j) as a single sample for the n samples in the interval, performing the operation in equation (1) below.

$$Ave(j) = \frac{\sum_{i=1}^{n} \{z(i)\}^2}{n} \quad (1)$$

The letter i indicates the i-th sample, and the letter j indicates the j-th interval.

The memory 2 stores the mean square value Ave(j) obtained by the mean square circuit 1.

The gain coefficient generating circuit 3 averages the N mean square values Ave(j) stored in the memory 2 to obtain a value Vr (see equation (2) below) under the control of the control circuit 6. The gain coefficient generating circuit 3 also divides a preset reference output level value Lv by the averaged value Vr to generate a gain coefficient Ag (see equation (3) below).

$$Vr = \frac{\sum_{j=1}^{n} Ave(j)}{n} \quad (2)$$

$$Ag = \frac{Lv}{Vr} \quad (3)$$

The decision circuit 5 monitors the mean square value Ave(j) calculated by the mean square circuit 1 to detect sharp changes in the received level of the signal. For example, the decision circuit 5 divides the mean square value Ave(j) in the adjacent sample interval by the mean square value Ave(j−1) and decides that a sharp change in the received level has occurred if the divided value is equal to or greater than a preset threshold value. The method by which the decision circuit 5 identifies a sharp change in the received level is not limited to any specific method, however. When the decision circuit 5 decides that a sharp change in the received level of the signal has occurred, it notifies the control circuit 6.

When the control circuit 6 receives a notification from the decision circuit 5 that a sharp change in the received level of the signal has occurred, it refers to the table ROM 7 and sets or alters the number of intervals N at which the averaging process is performed by the gain coefficient generating circuit 3, and/or the temporal alteration interval of the gain coefficient.

The table ROM 7 stores a means for deciding, from changes in the received level obtained from the decision circuit 5, the number N of mean square values on which the averaging process is performed by the gain coefficient generating circuit 3, a means for deciding the updating interval of the gain coefficient, and the number N of mean square values and the updating interval of the gain coefficient.

The gain coefficient linear smoother 8 linearly smoothes the gain coefficient before and after an update of the gain coefficient calculated by the gain coefficient generating circuit 3, and supplies the smoothed coefficient to the multiplier 4.

(A-2) Operation of the First Embodiment

Figure 3:
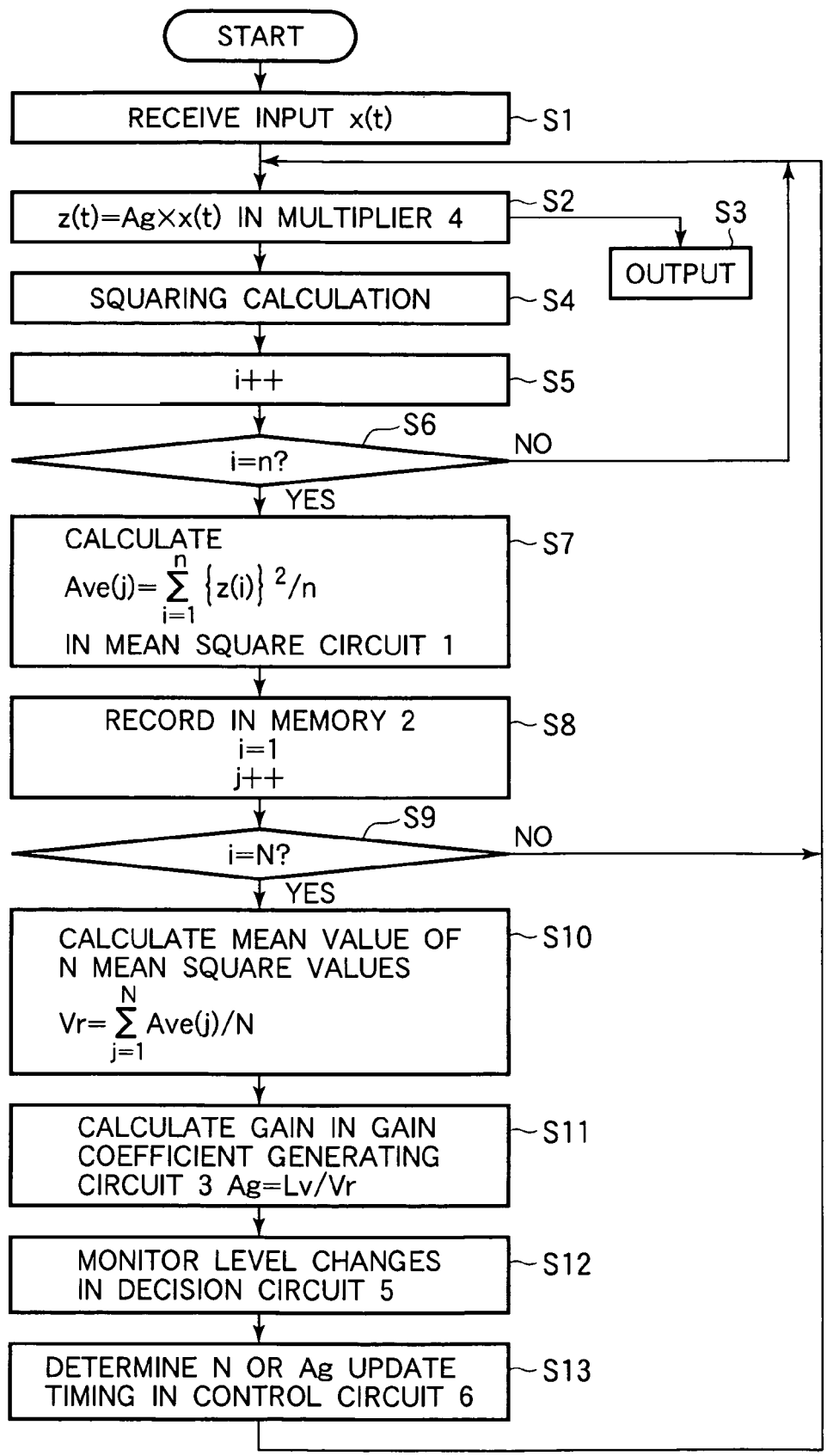
FIG. 3 is a flowchart illustrating the operation of the conventional automatic gain control apparatus.
Figure 4A:
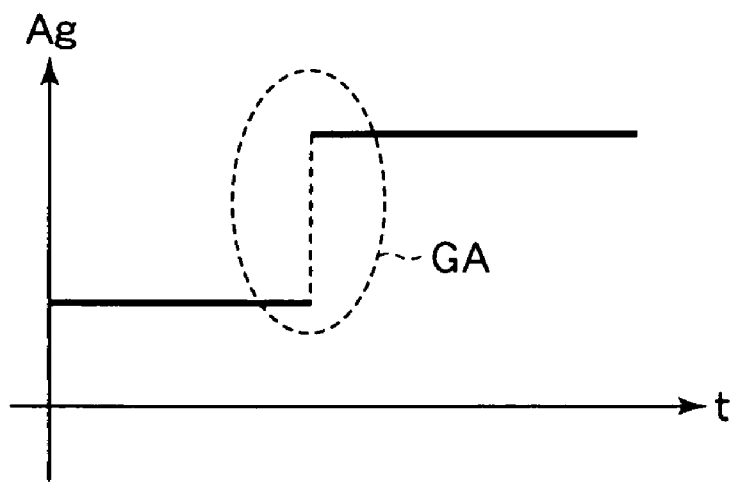
FIGS. 4A and 4B illustrate the updating of the gain coefficient in the conventional automatic gain control apparatus.
Figure 4B:
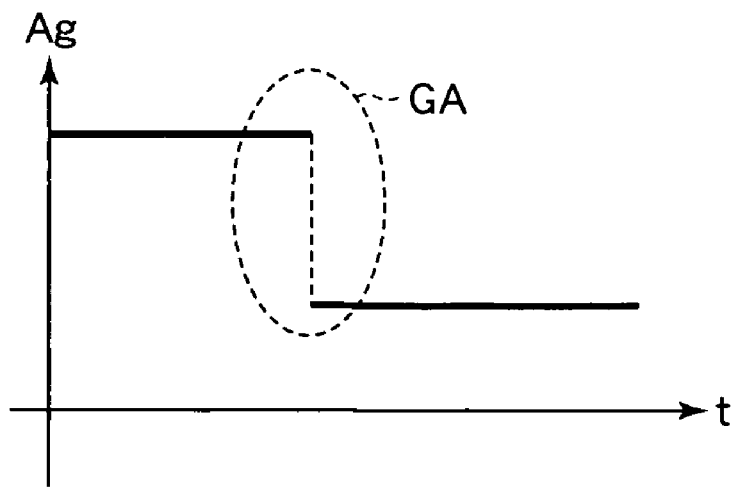

The operation of the automatic gain control apparatus 100A according to the first embodiment will be described below with reference to the attached drawings. The overall operation of the automatic gain control apparatus 100A corresponds to the operation of the conventional automatic gain control apparatus 100 shown in FIG. 3.

The operation of the gain coefficient linear smoother 8 in the automatic gain control apparatus 100A according to the first embodiment will be described below in detail with reference to FIG. 5.

Figure 5:
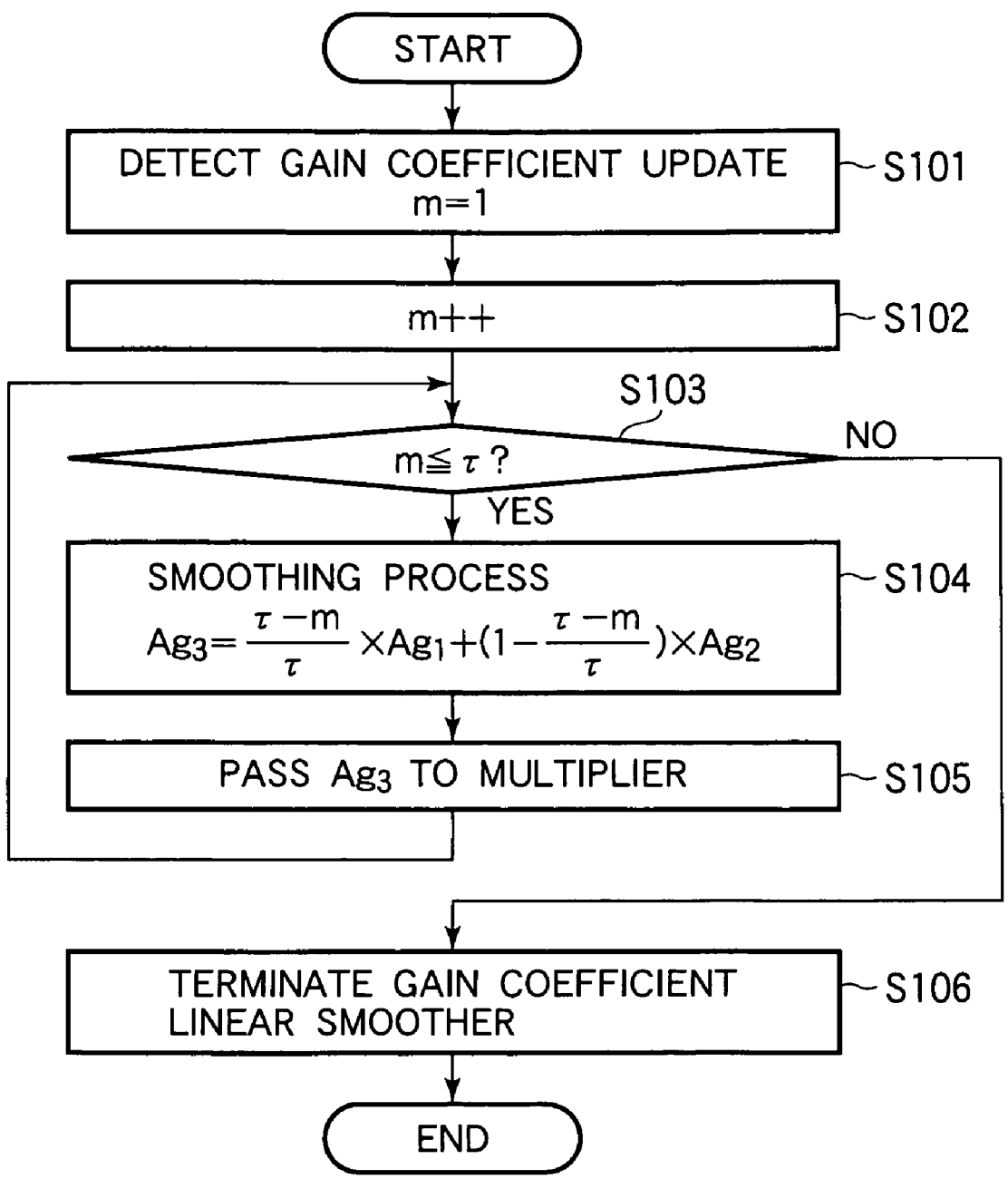
FIG. 5 is a flowchart illustrating the operation of the gain coefficient linear smoother in the first embodiment.

In FIG. 5, the gain coefficient linear smoother 8 detects that the gain coefficient has been altered by the gain coefficient generating circuit 3 (step S101). The gain coefficient linear smoother 8 is equipped with a counter; simultaneously with the alteration of the gain coefficient, it now initializes the counter value m (to m=1) and then increments the counter value m by one at predetermined time intervals (step S102). In the first embodiment, the counter value m is described as being incremented by one, but it may be incremented by any positive integer number.

An interval length τ during which the gain coefficient linear smoother 8 is operated is set in the table ROM 7 in advance, and the gain coefficient linear smoother 8 compares the counter value m with the interval length τ to decide whether to continue or terminate the smoothing process (step S103).

The interval length τ during which the gain coefficient linear smoother 8 is operated is a quantity directly related to the tracking speed of the gain coefficient. If the interval length τ is set to a small value, tracking toward the gain coefficient after an update is quick, but the sound level after the application of the gain coefficient also changes sharply, so a strange acoustic sensation occurs. If the interval length τ is set to a large value, tracking toward the gain coefficient after an update is slow and the gain coefficient cannot change rapidly in response to sharp changes in the sound level. The interval length τ should therefore be set to an appropriate value. In the first embodiment, for example, the interval length τ is set to a value of three seconds (equivalent to 24000 samples if the sampling frequency is 8 kHz). The value of the interval length τ, however, is not limited to this value.

If the counter value m is less than the interval length τ in step S103, the process proceeds to step S104, in which a smoothing process is performed by the gain coefficient linear smoother 8 (step S104).

In the smoothing process in the first embodiment, the gain coefficient linear smoother 8 first receives the gain coefficient $Ag_1$ before the update and the gain coefficient $Ag_2$ after the update from the gain coefficient generating circuit 3, obtains a gain coefficient $Ag_3$ from the following equation (4), and supplies the calculated gain coefficient $Ag_3$ to the multiplier 4 (steps S104 and S105). This enables the smoothed value of the gain coefficient $Ag_3$ to make a smooth transition from gain coefficient $Ag_1$ to gain coefficient $Ag_2$.

$$Ag_3 = \frac{\tau - m}{\tau} Ag_1 + \left(1 - \frac{\tau - m}{\tau}\right) Ag_2 \qquad (4)$$

From equation (4), the smoothed gain coefficient $Ag_3$ is obtained by changing the weights of the gain coefficient $Ag_1$ before the update and the new gain coefficient $Ag_2$ after the update according to the counter value m in an interval of the interval length $\tau$. According to this method, since the weights of the gain coefficient $Ag_1$ before the update and the new gain coefficient $Ag_2$ after the update can be changed gradually as the counter value m is incremented, it is possible to change the gain coefficient $Ag_3$ smoothly.

Figure 6A:
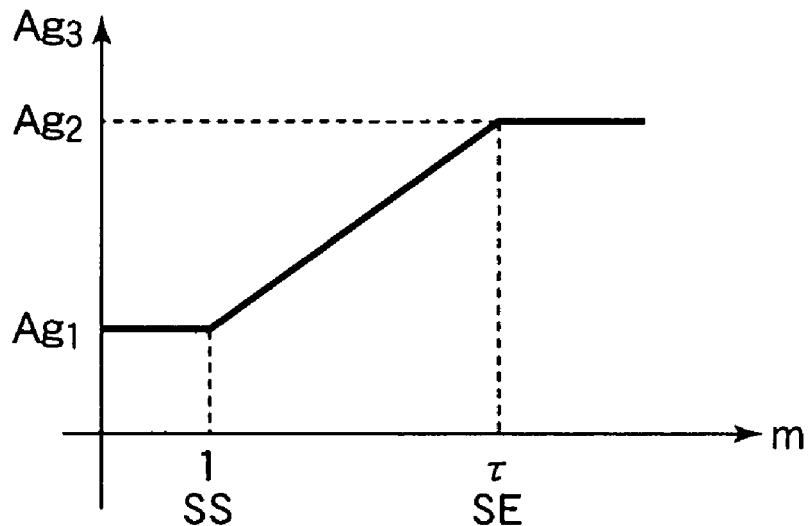
FIGS. 6A and 6B illustrate the smoothing of the gain coefficient in the automatic gain control apparatus in the first embodiment.
Figure 6B:
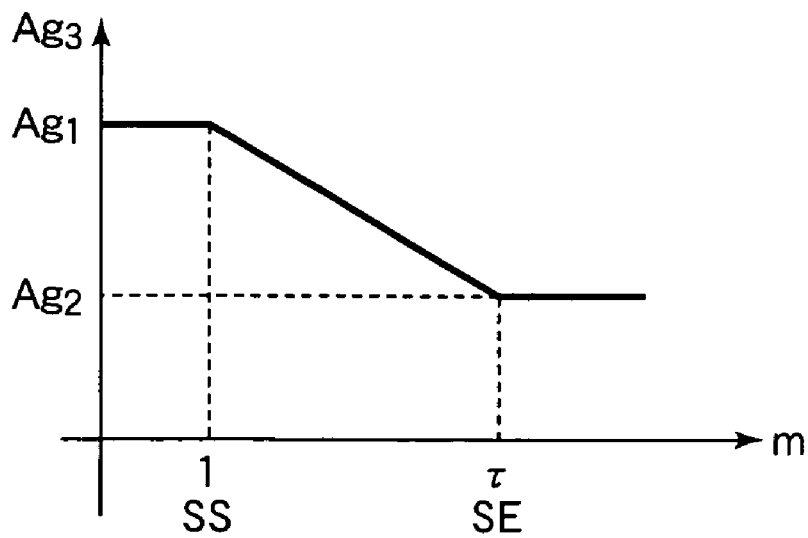

FIGS. 6A and 6B illustrate the updating of the gain coefficient $Ag_3$ smoothed by the gain coefficient linear smoother 8: FIG. 6A illustrates a case in which the gain coefficient increases; FIG. 6B illustrates another case in which the gain coefficient decreases.

In FIG. 6A, after detecting an update of the gain coefficient, the gain coefficient linear smoother 8 initializes the counter value (to m=1) and starts a smoothing process (at SS in FIGS. 6A and 6B). During an interval of the interval length $\tau$, the gain coefficient $Ag_3$ is then continuously calculated using the above equation (4), thereby enabling the gain coefficient to change smoothly from $Ag_1$ to $Ag_2$. In FIG. 6B, similarly, the gain coefficient can also be smoothly changed from $Ag_1$ to $Ag_2$ during an interval of the interval length $\tau$.

In step S103, if the counter value m is greater than or equal to the interval length $\tau$, a decision is made to terminate the smoothing process, and the smoothing process by the gain coefficient linear smoother 8 ends (step S106) (at SE in FIGS. 6A and 6B).

Although the first embodiment has been described as performing smoothing on the basis of the above equation (4), it is not limited to equation (4) as long as a smoothing characteristic can be obtained; a data table prepared in advance by the designer, for example, may be used instead.

Figure 7A:
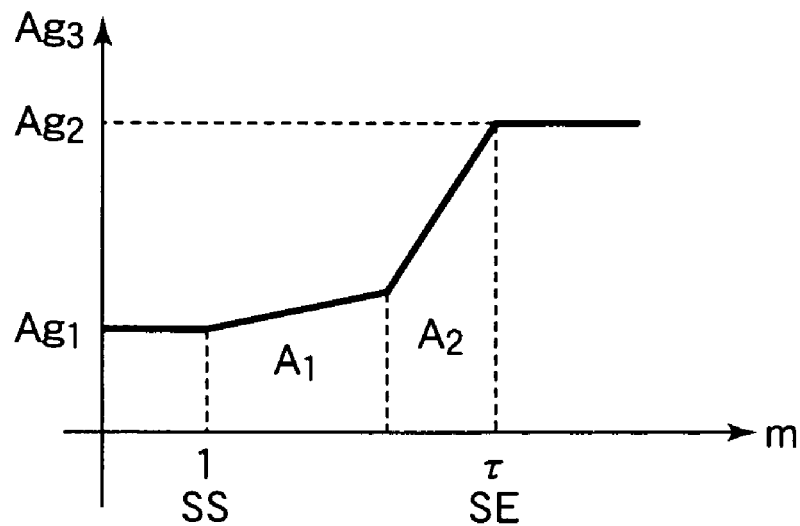
FIGS. 7A and 7B illustrate the smoothing of the gain coefficient in the automatic gain control apparatus in a variation of the first embodiment.
Figure 7B:
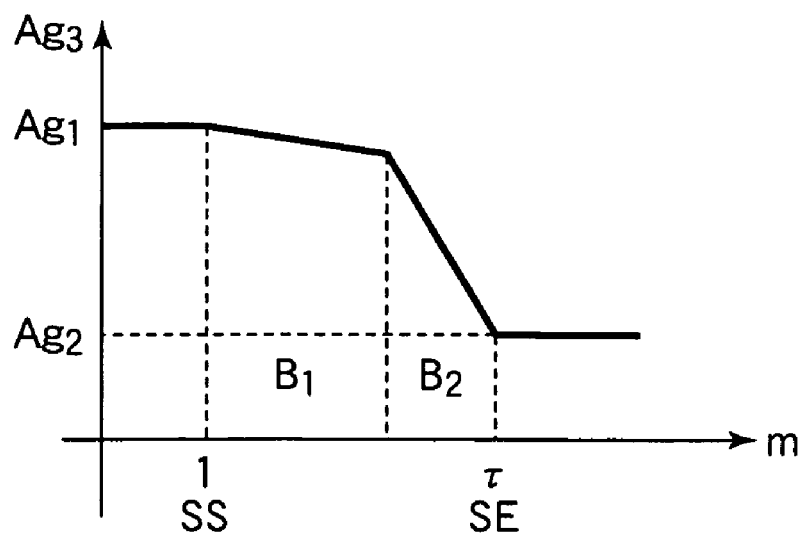

In the first embodiment described above, the smoothing process has also been shown as being performed using only one equation. The smoothing process, however, may be performed using two or more different equations. FIGS. 7A and 7B show examples in which two equations are used in the interval of length $\tau$ after an update of the gain coefficient has been detected, giving a two-step smoothing characteristic from $Ag_1$ to $Ag_2$. The two processing steps A1, A2 in FIG. 7A and B1, B2 in FIG. 7B employ different processes.

(A-3) Effect of the First Embodiment

As described above, according to the first embodiment, when an update of the gain coefficient is detected, the gain coefficient difference before and after the update is linearly smoothed over an interval of a predetermined length. It is thereby possible to prevent jumps in the gain coefficient before and after updates, eliminate strange acoustic sensations, and consequently improve communication quality.

(B) Second Embodiment

Next, an automatic gain control apparatus according to a second embodiment of the invention will be described with reference to the attached drawings.

As in the first embodiment, the second embodiment will be described as being used in a device that employs the inventive automatic gain control apparatus to control the gain of an audio signal.

The automatic gain control apparatus according to the first embodiment has been described as performing a linear smoothing process on the gain coefficient, but the automatic gain control apparatus in the second embodiment will be described as performing a nonlinear smoothing process on the gain coefficient. This is because the human sense of hearing has the property that nonlinear characteristics are perceived as more natural, so a nonlinear smoothing process can provide more pleasing acoustic sensations.

Figure 8:
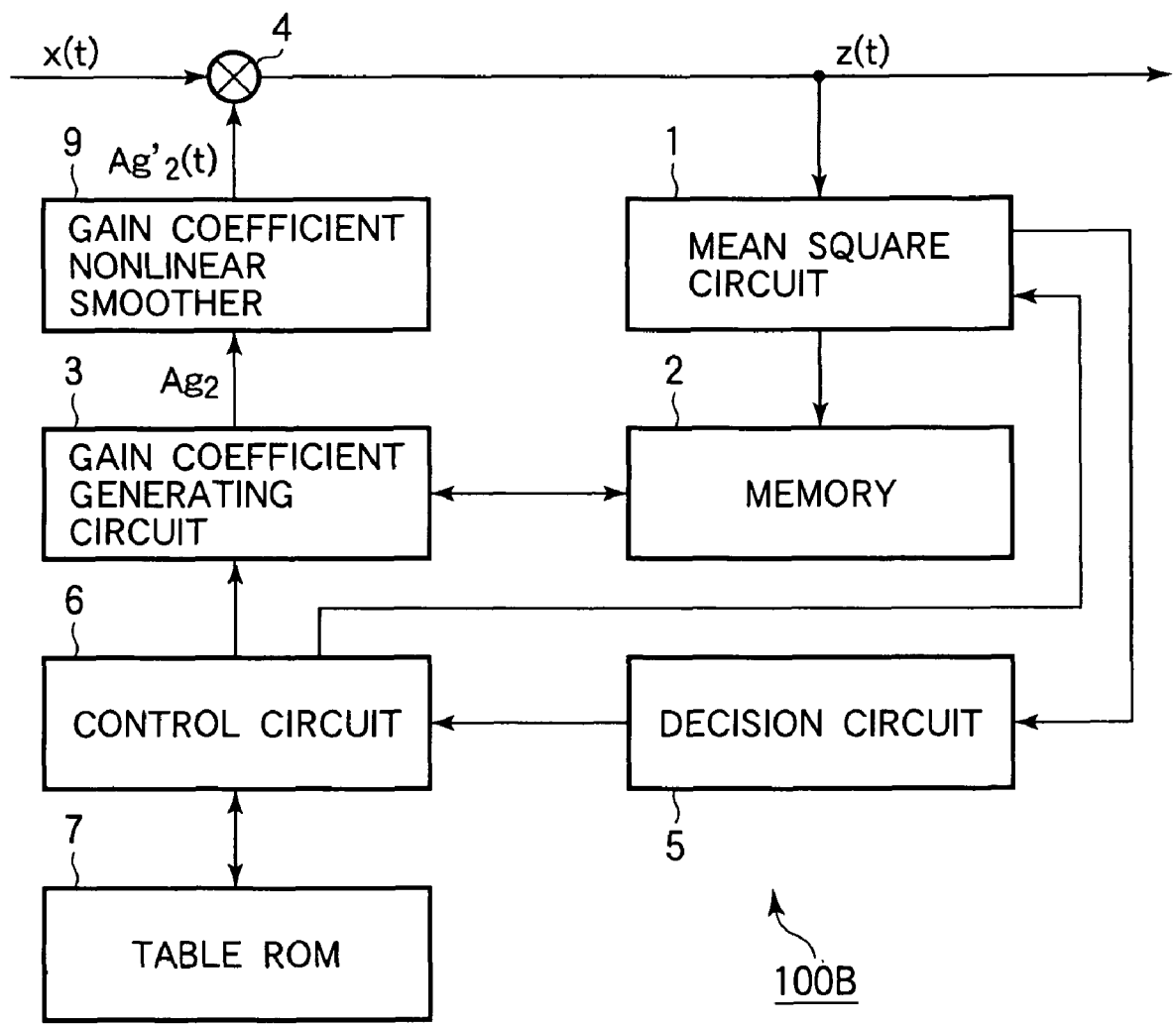
FIG. 8 is a block diagram showing the structure of an automatic gain control apparatus in a second embodiment of the invention.

FIG. 8 is a block diagram showing the structure of an automatic gain control apparatus 100B according to the second embodiment. As shown in FIG. 8, the automatic gain control apparatus 100B comprises a mean square circuit 1, a memory 2, a gain coefficient generating circuit 3, a multiplier 4, a decision circuit 5, a control circuit 6, a table ROM 7, and a gain coefficient nonlinear smoother 9.

The structure of the second embodiment differs from the structure of the first embodiment only in that the gain coefficient linear smoother 8 is replaced with the gain coefficient nonlinear smoother 9. Therefore, only the structure and operation of the gain coefficient nonlinear smoother 9 will be described here.

The gain coefficient nonlinear smoother 9 nonlinearly smoothes the gain coefficient difference before and after an update, which is calculated by the gain coefficient generating circuit 3, and supplies the nonlinearly smoothed gain coefficient $Ag_2'(t)$ to the multiplier 4.

The operation of the gain coefficient nonlinear smoother 9 in the automatic gain control apparatus 100B according to the second embodiment will be described with reference to the attached drawings.

Figure 9:
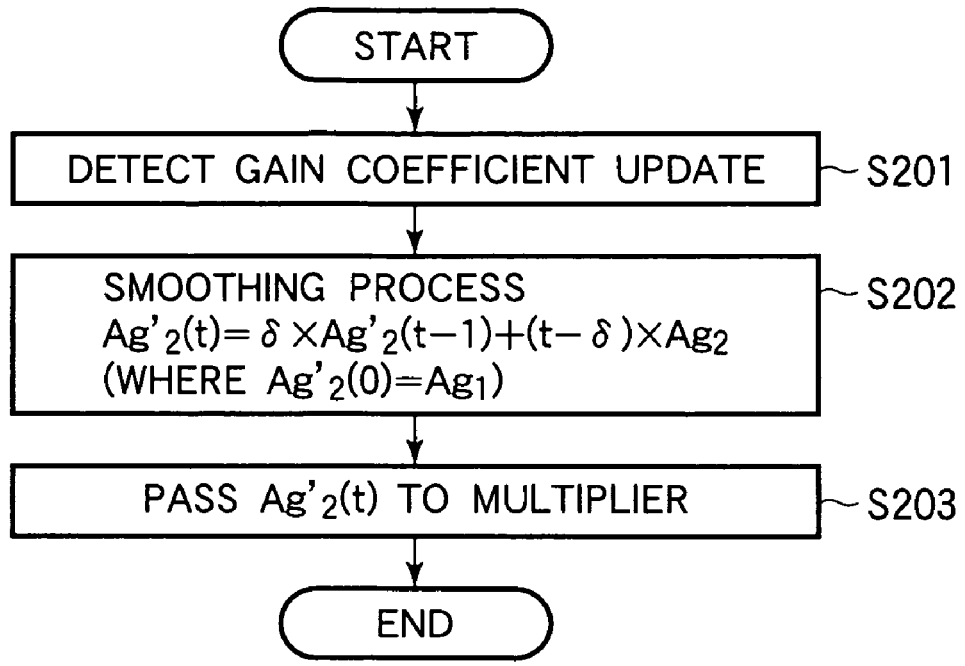
FIG. 9 is a flowchart illustrating the operation of the gain coefficient nonlinear smoother in the second embodiment.

As shown in FIG. 9, as in the first embodiment, when the gain coefficient nonlinear smoother 9 detects that the gain coefficient has been altered by the gain coefficient generating circuit 3 (step S201), it performs a smoothing process (step S202) and passes the calculated gain coefficient to the multiplier 4 (step S203).

In this case, the gain coefficient nonlinear smoother 9 performs a smoothing process in which, based on the gain coefficients $Ag_1$, $Ag_2$ before and after an update, a smoothed gain coefficient $Ag_2'(t)$ is obtained from the following equation (5).

$$Ag_2'(t) = \delta \times Ag_2'(t-1) + (1-\delta) \times Ag_2 \qquad (5)$$

where, $Ag_2'(0) = Ag_1$

Figure 10:
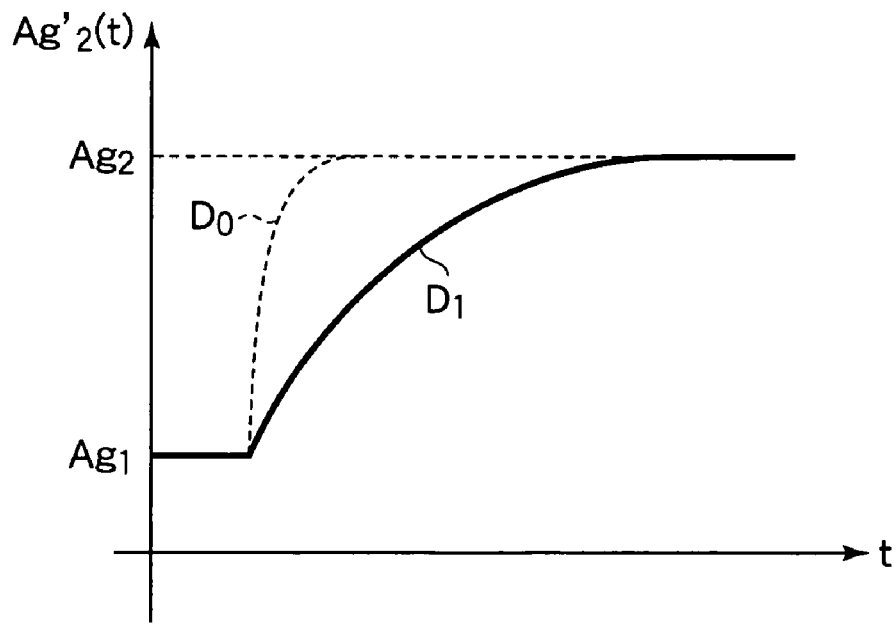
FIG. 10 illustrates a difference in nonlinearity due to a difference in the value of the time constant δ in the automatic gain control apparatus in the second embodiment.

In equation (5), t indicates time and $\delta$ indicates a time constant, which is a value that determines the smoothing speed of the gain coefficient. The time constant $\delta$ can take any value greater than zero and less than one. FIG. 10 shows different nonlinearities due to different values of $\delta$. As shown in FIG. 10, as the time constant $\delta$ approaches zero, the smoothing speed increases (dotted line $D_0$ in FIG. 10), and as the time constant $\delta$ approaches one, the smoothing speed decreases (solid line $D_1$ in FIG. 10). The value of the time constant $\delta$ is not limited to a specific value; any appropriate value can be employed: the value is 0.9 in the second embodiment.

Figure 11A:
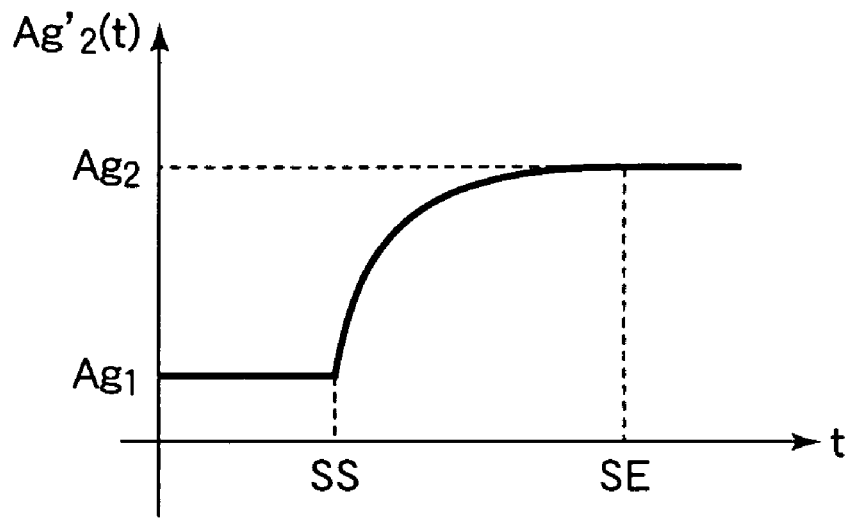
FIGS. 11A and 11B illustrate the smoothing of the gain coefficient in the automatic gain control apparatus in the first embodiment.
Figure 11B:
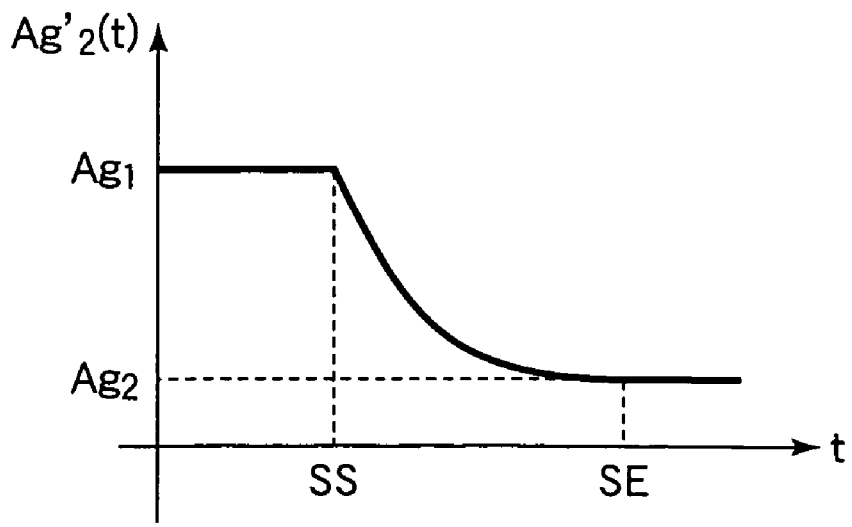

FIGS. 11A and 11B illustrate the updating of the gain coefficient $Ag_2'(t)$ smoothed by the gain coefficient nonlinear smoother 9 in the second embodiment: FIG. 11A illustrates a case in which the gain coefficient increases; FIG. 11B illustrates a case in which the gain coefficient decreases.

If the smoothing of the gain coefficient shown in FIGS. 11A and 11B is compared with the smoothing of the gain coefficient shown in FIGS. 6A and 6B, it will be appreciated that the smoothing of the gain coefficient by the gain coefficient nonlinear smoother 9 shown in FIGS. 11A and 11B is achieved by a nonlinear change of the gain coefficient. A psychoacoustically natural smoothing process can thereby be implemented.

Although the second embodiment has been described as performing smoothing on the basis of the above equation (5), a data table prepared in advance by the designer may be used instead, provided the desired smoothing characteristic can be obtained.

Figure 12A:
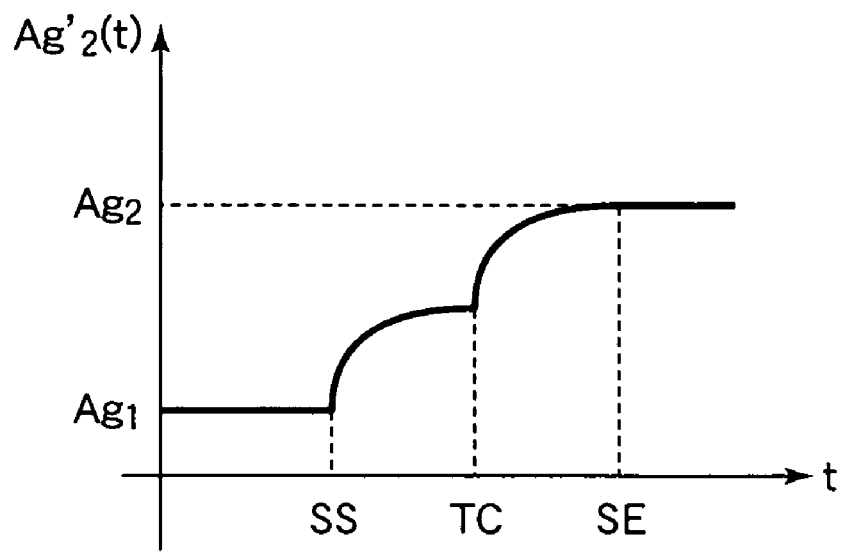
FIGS. 12A and 12B illustrate the smoothing of the gain coefficient in the automatic gain control apparatus in a variation of the second embodiment.
Figure 12B:
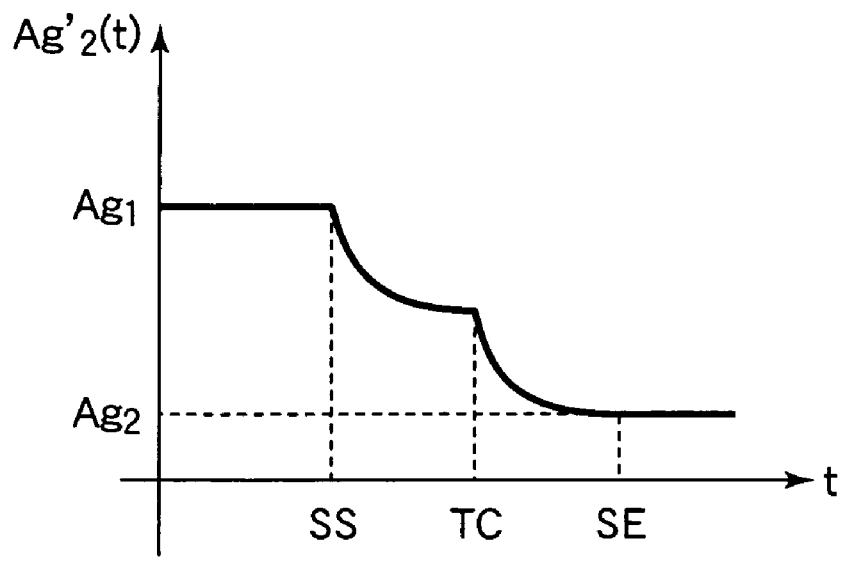

The smoothing process in the second embodiment has been described as being performed using only one time constant, but the smoothing process may be performed using two or more time constants. FIGS. 12A and 12B, for example, illustrate the smoothing of the gain coefficient when two time constants are used to obtain a nonlinear characteristic. In FIGS. 12A and 12B, a process is performed in which the value of the time constant δ at the start of smoothing SS is altered at a time constant transition TC.

As described above, according to the second embodiment, the same effects as in the first embodiment can be obtained. In addition, according to the second embodiment, it is possible to obtain psychoacoustically natural smoothing, reduce power consumption, and consequently improve communication quality.

(C) Third Embodiment

Next, an automatic gain control apparatus according to a third embodiment of the invention will be described with reference to the attached drawings.

As in the first embodiment, the third embodiment will also be described as being used for controlling the gain of an audio signal.

The gain coefficient was smoothed using a time constant transition in the second embodiment, but a problem of this method is that although the gain coefficient approaches the gain coefficient $Ag_2$ at which it is targeted after the smoothing operation, it never completely coincides with the gain coefficient $Ag_2$. There is therefore a possibility that the target level will not have been reached when the smoothing is terminated.

To solve this problem, the third embodiment provides a nonlinear smoothing method by which the target level is reached reliably and precisely. The third embodiment is characterized by using a nonlinear mathematical function to smooth the gain coefficient before and after an update.

The structure of the automatic gain control apparatus according to the third embodiment corresponds to the structure described in the second embodiment shown in FIG. 8, so it will be described with reference to FIG. 8.

The difference between the third embodiment and the second embodiment lies in the function of the gain coefficient nonlinear smoother 9, particularly in the different nonlinear functions used in the smoothing process of the gain coefficient nonlinear smoother 9. The operation of the gain coefficient nonlinear smoother 9 will therefore be described in detail below.

When an update of the gain coefficient by the gain coefficient generating circuit 3 is detected, the gain coefficient nonlinear smoother 9 decides whether the update increases or decreases the gain coefficient and smoothes the gain coefficient using a predetermined nonlinear function according to the result of this decision.

When a nonlinear function y=f(x) is plotted in a coordinate system in which the variable x is indicated on the horizontal axis and the variable y is indicated on the vertical axis, the nonlinear function y=f(x) can be represented by two types of functions: one type can be expressed by an upwardly convex curve; the other type can be expressed by a downwardly convex curve. In the third embodiment, cases in which the gain coefficient is smoothed using an upwardly convex nonlinear function and in which the gain coefficient is smoothed using a downwardly convex nonlinear function will both be described.

The function expressed by the following equation (6) is a specific example of the downwardly convex nonlinear function $Ag_2'(t)$ used in the gain coefficient nonlinear smoother 9 in the third embodiment.

$$Ag_2'(t) = Ag_1 \times \xi_1^t \quad (6)$$

In the above equation (6), $\xi_1$ indicates a smoothing parameter: when $\xi_1 > 1$, the nonlinear function has a monotonically increasing characteristic; when $0 < \xi_1 < 1$, the nonlinear function has a monotonically decreasing characteristic.

Functions expressed by the following equations (7) and (8) are specific examples of the upwardly convex nonlinear function $Ag_2'(t)$ used in the gain coefficient nonlinear smoother 9 of the third embodiment: equation (7) represents a monotonically decreasing function and equation (8) represents a monotonically increasing function.

$$Ag_2'(t) = Ag_1 + \alpha \times t^2 \quad (\alpha: \text{negative constant}) \quad (7)$$

$$Ag_2'(t) = Ag_1 \times t^2 \times \beta\sqrt{t} \quad (\beta: \text{positive constant}) \quad (8)$$

In equations (7) and (8), t indicates time; t is initialized to zero at every update of the gain coefficient and is incremented by one at every one sample. The timing of the increment, however, need not be once per sample; t may be incremented at intervals of an arbitrary number of samples such as, for example, once every ten samples. The amount of the increment also need not be by one; t may be incremented by an arbitrary amount such as, for example, five.

Figure 13:
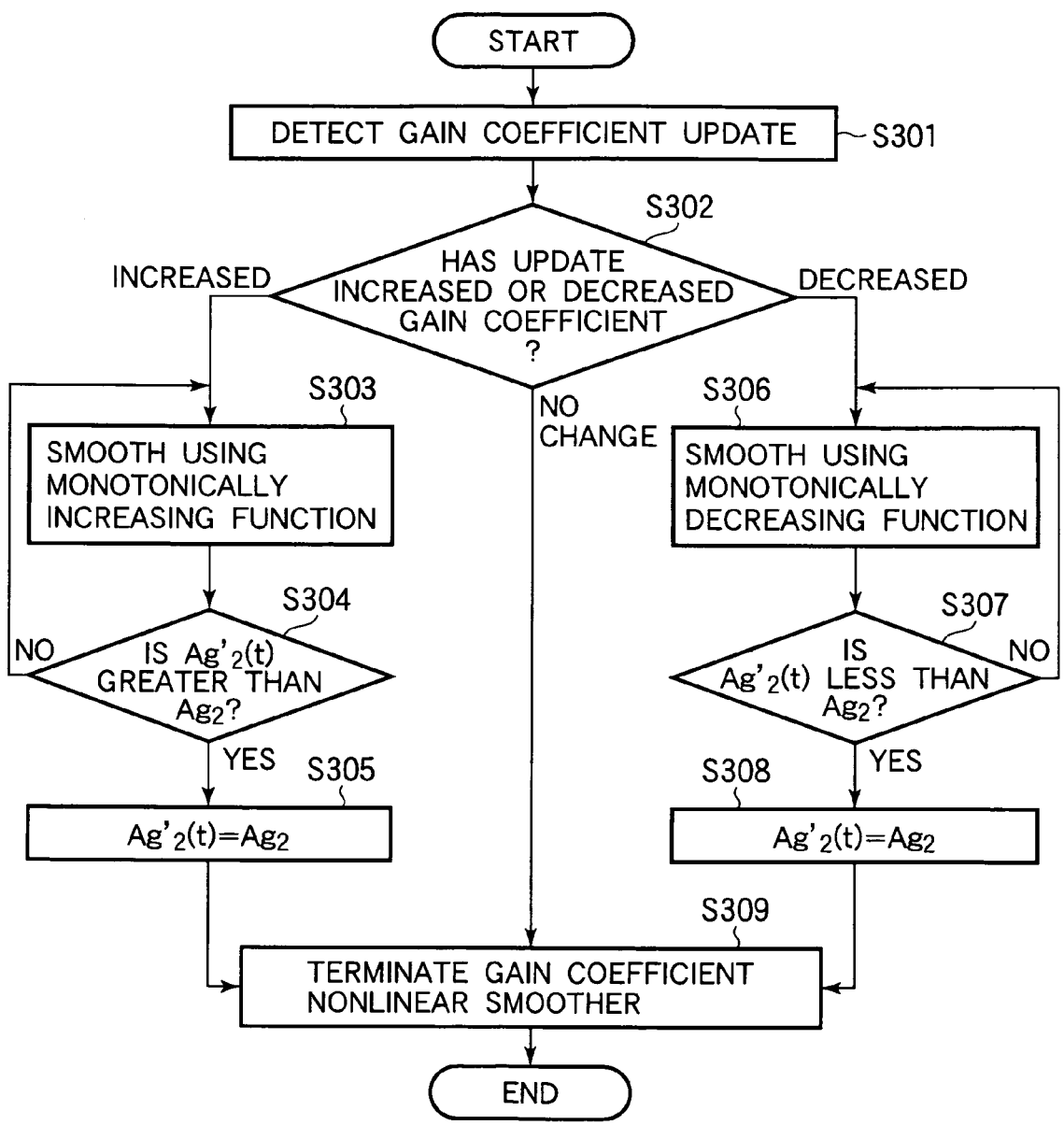
FIG. 13 is a flowchart illustrating the operation of the gain coefficient nonlinear smoother in a third embodiment of the invention.

FIG. 13 is a flowchart illustrating the operation of the gain coefficient nonlinear smoother 9 in the automatic gain control apparatus according to the third embodiment.

First, when the gain coefficient nonlinear smoother 9 in the third embodiment detects an update of the gain coefficient by the gain coefficient generating circuit 3 (step S301), it decides whether the update has increased or decreased the gain coefficient (step S302).

This decision is necessary to make the smoothed gain coefficient converge to the gain coefficient $Ag_2$ after the update. This is because when the gain coefficient has increased, it cannot converge to $Ag_2$ unless a nonlinear function with a monotonically increasing smoothing characteristic is used. Conversely, if the gain coefficient has decreased, it cannot converge to $Ag_2$ unless a nonlinear function with a monotonically decreasing smoothing characteristic is used. To change the smoothing process to be used depending on whether the gain coefficient increases or decreases, it is therefore necessary to decide whether the gain coefficient has increased or decreased.

According to the decision result in step S302, the procedure branches into three processes, which will be described individually.

First, if the update has increased the gain coefficient, the procedure proceeds to step S303, in which the gain coefficient nonlinear smoother 9 selects a monotonically increasing function and performs the smoothing process (step S303). Then a decision whether to terminate the smoothing process using the monotonically increasing function is made (step S304). The decision method employed here is that the magnitude of the gain coefficient $Ag_2'(t)$ during the smoothing process is compared with the magnitude of the gain coefficient $Ag_2$ after the update and if $Ag_2'(t)$ is greater than $Ag_2$, the smoothing of the gain coefficient is terminated. Since $Ag_2'(t)$ is larger than the target value $Ag_2$ at this stage, however, it is replaced with $Ag_2$ in step S305 (steps S305 and S309).

Next, if the update has decreased the gain coefficient, the procedure proceeds to step S307, in which the gain coefficient nonlinear smoother 9 selects a monotonically decreasing function and performs the smoothing process (step S306). A decision whether to terminate the smoothing process using the monotonically decreasing function is then made (step S307). The decision method employed here is that the magnitude of the gain coefficient $Ag_2'(t)$ during the smoothing process is compared with the magnitude of the gain coefficient $Ag_2$ after the update and if $Ag_2'(t)$ is less than $Ag_2$, the smoothing of the gain coefficient is terminated. Since $Ag_2'(t)$ is smaller than the target value $Ag_2$ at this stage, however, it is replaced with $Ag_2$ in step S308 (steps S308 and S309).

Finally, if the update has not changed the gain coefficient, the smoothing process is not carried out (step S309).

Figure 14:
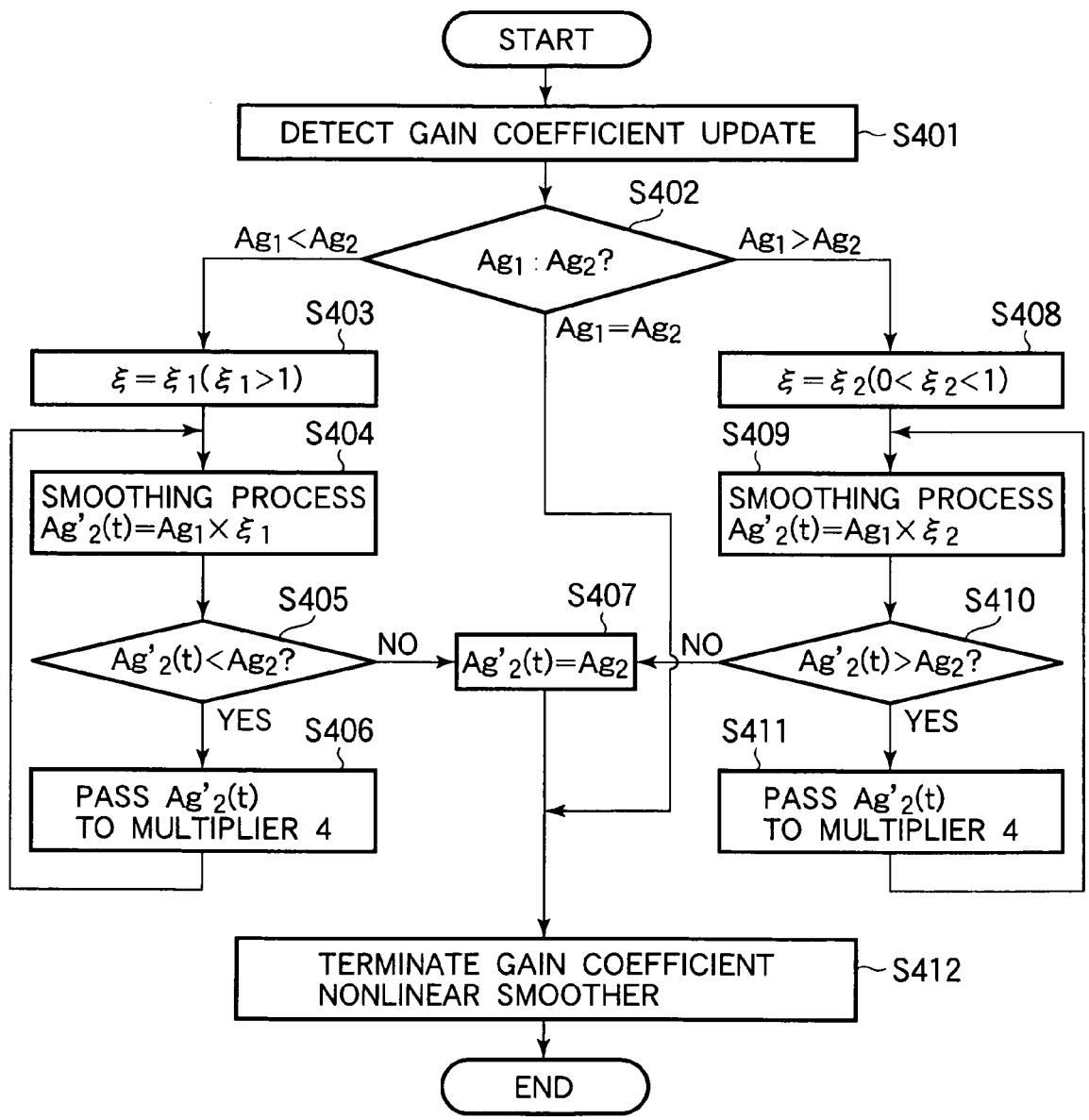
FIG. 14 is a flowchart illustrating the operation of the gain coefficient nonlinear smoother in the third embodiment.

Next, a process using equation (6) as a specific example of the nonlinear function will be described with reference to FIG. 14.

First, when the gain coefficient nonlinear smoother 9 detects an update of the gain coefficient (step S401), it compares the gain coefficient $Ag_1$ before the update with the gain coefficient $Ag_2$ after the update and decides whether the update has increased or decreased the gain coefficient (step S402).

If it is decided in step S402 that the update has increased the gain coefficient $Ag_2$, the procedure proceeds to step S403 and $\xi_1$ ($\xi_1 > 1$) is set as a smoothing parameter (step S403). The nonlinear function can thereby be given a monotonically increasing characteristic.

Next, the gain coefficient nonlinear smoother 9 carries out the smoothing process using equation (6) with the set parameter $\xi_1$ (step S404). The gain coefficient nonlinear smoother 9 then compares the $Ag_2'(t)$ obtained by the above equation (6) with $Ag_2$ (step S405) and, if $Ag_2$ is greater than $Ag_2'(t)$, passes $Ag_2'(t)$ to the multiplier 4 and continues the smoothing process (step S406). If $Ag_2$ is less than $Ag_2'(t)$, the gain coefficient nonlinear smoother 9 terminates the smoothing process and uses $Ag_2$ as the gain coefficient thereafter (steps S407 and S412).

If it is decided in step S402 that the update has decreased the gain coefficient $Ag_2$, the procedure proceeds to step S408 and $\xi_2$ ($0 < \xi_2 < 1$) is set as the smoothing parameter (step S408). The nonlinear function can thereby be given a monotonically decreasing characteristic.

Next, the gain coefficient nonlinear smoother 9 carries out the smoothing process using equation (6) with the set parameter $\xi_2$ (step S409). The gain coefficient nonlinear smoother 9 then compares the $Ag_2'(t)$ obtained by the above equation (6) with $Ag_2$ (step S410) and, if $Ag_2$ is less than $Ag_2'(t)$, passes $Ag_2'(t)$ to the multiplier 4 and continues the smoothing process (step S411). If $Ag_2$ is greater than $Ag_2'(t)$, the gain coefficient nonlinear smoother 9 terminates the smoothing process and uses $Ag_2$ as the gain coefficient thereafter (steps S407 and S412).

If it is decided in step S402 that the update has not changed the gain coefficient, the gain coefficient nonlinear smoother 9 does not carry out the smoothing process (step S412).

Figure 16A:
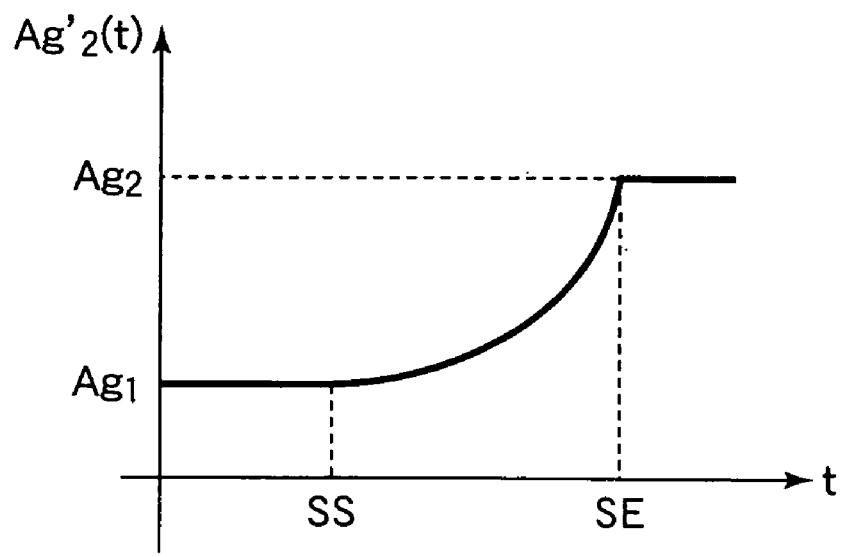
FIGS. 16A and 16B illustrate the smoothing of the gain coefficient by the gain coefficient nonlinear smoother in the third embodiment.
Figure 16B:
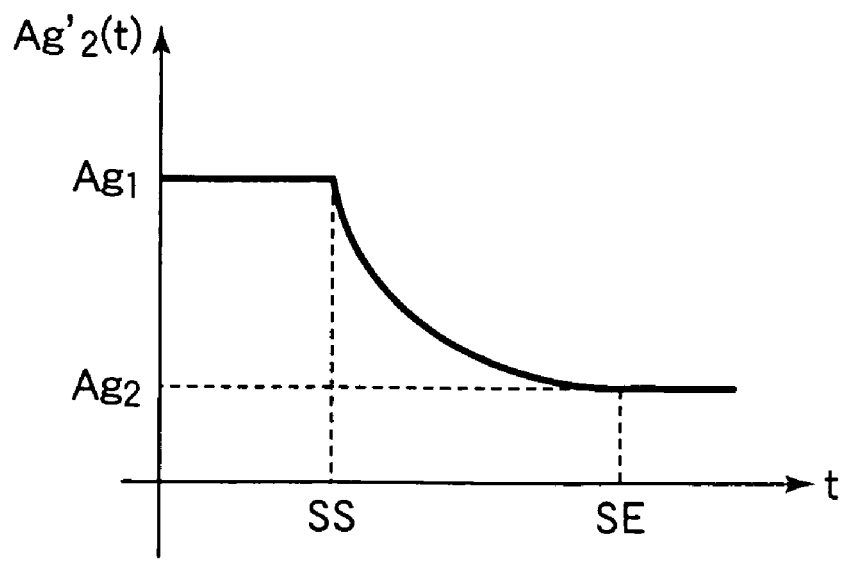

FIGS. 16A and 16B illustrate the updating of the gain coefficient smoothed by the gain coefficient nonlinear smoother 9 using equation (6): FIG. 16A illustrates a case in which the gain coefficient increases; FIG. 16B illustrates a case in which the gain coefficient decreases.

As shown in FIGS. 16A and 16B, the gain coefficient nonlinear smoother 9 can detect an update of the gain coefficient, initiate the smoothing process, and smooth the gain coefficient from $Ag_1$ to $Ag_2$ with a downwardly convex nonlinear characteristic.

Next, a process using the above equations (7) and (8) will be described with reference to FIG. 15.

Figure 15:
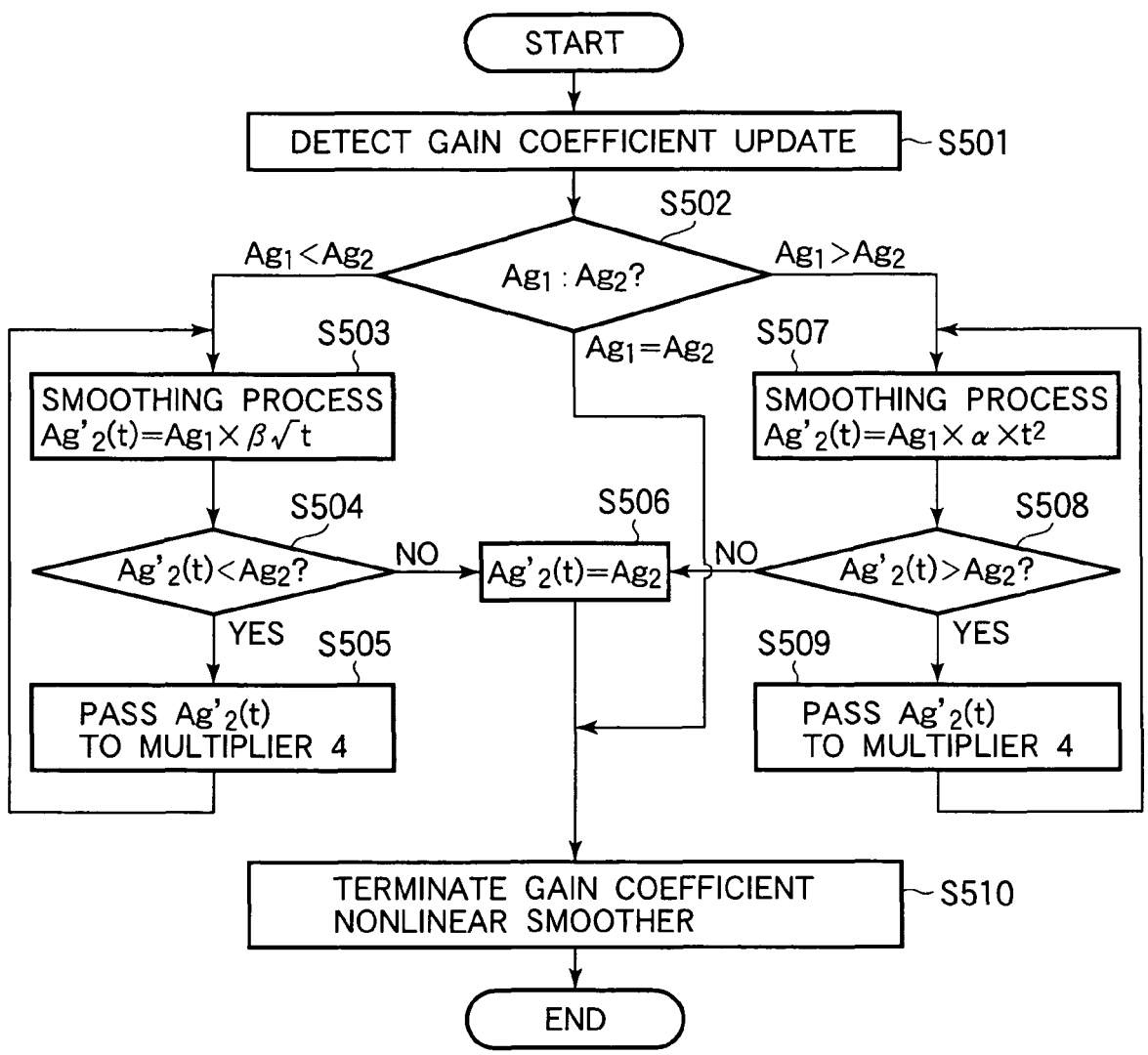
FIG. 15 is a flowchart illustrating the operation of the gain coefficient nonlinear smoother in the third embodiment.

In FIG. 15, when the gain coefficient nonlinear smoother 9 detects an update of the gain coefficient by the gain coefficient generating circuit 3 (step S501), it decides whether the update has increased or decreased the gain coefficient (step S502).

If it is decided in step S502 that the update has increased the gain coefficient $Ag_2$, the flow proceeds to step S503 and the gain coefficient nonlinear smoother 9 carries out the smoothing process using the monotonically increasing function expressed by equation (8), so that the gain coefficient converges to the gain coefficient $Ag_2$ after the update (step S503). The gain coefficient nonlinear smoother 9 then compares $Ag_2'(t)$ obtained by the above equation (8) with $Ag_2$ (step S504) and, if $Ag_2$ is greater than $Ag_2'(t)$, passes $Ag_2'(t)$ to the multiplier 4 and continues the smoothing process (step S505). If $Ag_2$ is less than $Ag_2'(t)$, the gain coefficient nonlinear smoother 9 terminates the smoothing process and uses $Ag_2$ as the gain coefficient thereafter (steps S506 and S510).

If it is decided in step S502 that the update has decreased the gain coefficient $Ag_2$, the flow proceeds to step S507 and the gain coefficient nonlinear smoother 9 carries out the smoothing process using the monotonically increasing function expressed by equation (7), so that the gain coefficient converges to the gain coefficient $Ag_2$ after the update (step S507). The gain coefficient nonlinear smoother 9 then compares $Ag_2'(t)$ obtained by the above equation (7) with $Ag_2$ (step S508) and, if $Ag_2$ is less than $Ag_2'(t)$, passes $Ag_2'(t)$ to the multiplier 4 and continues the smoothing process (step S509). If $Ag_2$ is greater than $Ag_2'(t)$, the gain coefficient nonlinear smoother 9 terminates the smoothing process and uses $Ag_2$ as the gain coefficient thereafter (steps S506 and S510).

If it is decided in step S502 that the update has not changed the gain coefficient, the gain coefficient nonlinear smoother 9 does not carry out the smoothing process (step S510).

Figure 17A:
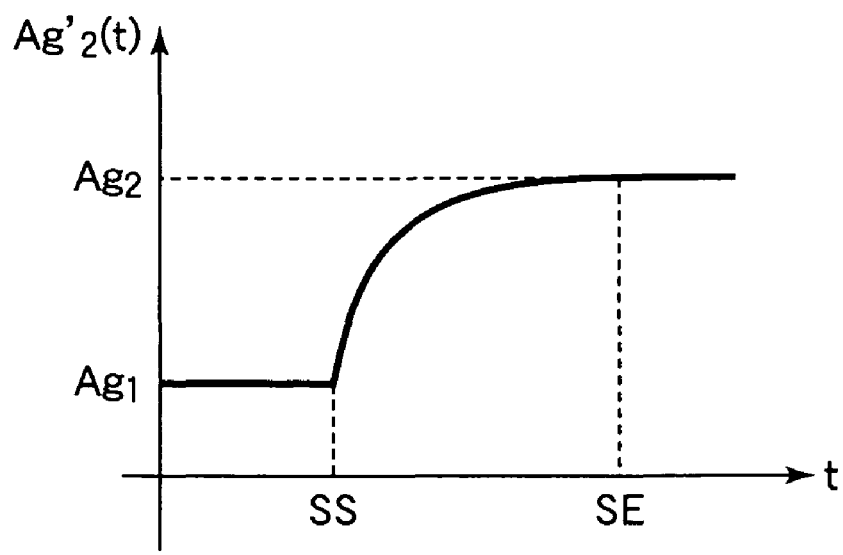
FIGS. 17A and 17B illustrate the smoothing of the gain coefficient by the gain coefficient nonlinear smoother in the third embodiment.
Figure 17B:
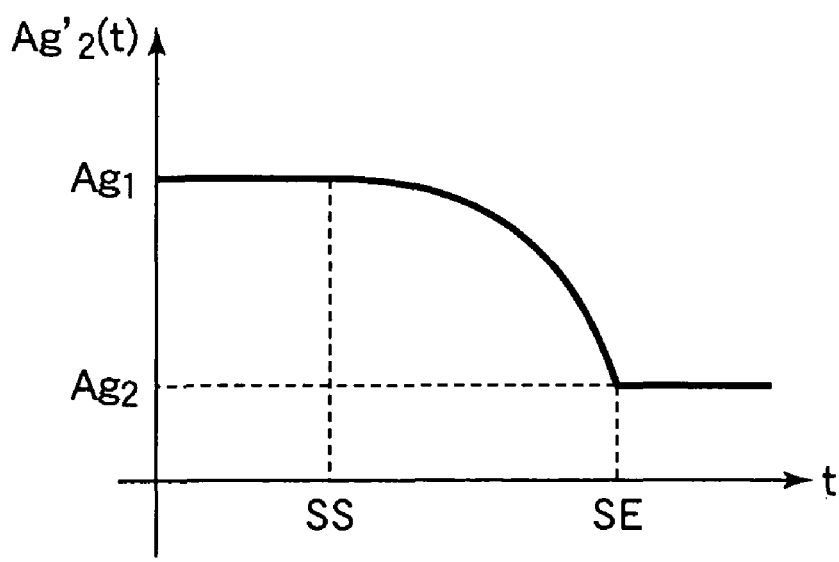

FIGS. 17A and 17B illustrate the updating of the gain coefficient smoothed by the gain coefficient nonlinear smoother 9 using equations (7) and (8): FIG. 17A illustrates a case in which the gain coefficient increases; FIG. 17B illustrates another case in which the gain coefficient decreases.

As shown in FIGS. 17A and 17b, the gain coefficient nonlinear smoother 9 can detect an update of the gain coefficient, initiate the smoothing process, and smooth the gain coefficient from $Ag_1$ to $Ag_2$ with an upwardly convex nonlinear characteristic.

In the third embodiment, equation (6) has been given as a specific example of a downwardly convex nonlinear function used in the gain coefficient nonlinear smoother 9 and equations (7) and (8) have been given as specific examples of upwardly convex nonlinear functions, but the nonlinear functions are not limited to any particular functions.

In the third embodiment, the parameters have been set such that $\xi_1 = 1.0$, $\xi_2 = 0.9$, $\alpha = -0.85$, and $\beta = 1.24$, but the parameters are not limited to these values.

Although the third embodiment has been described as performing smoothing on the basis of equations (6), (7), and (8), a data table prepared in advance by the designer may be used instead, provided a desired smoothing characteristic can be obtained.

As a variation of the third embodiment, the gain coefficient nonlinear smoother 9 may use two or more downwardly convex nonlinear functions or two or more upwardly convex nonlinear functions to obtain a nonlinear smoothing characteristic.

Figure 18A:
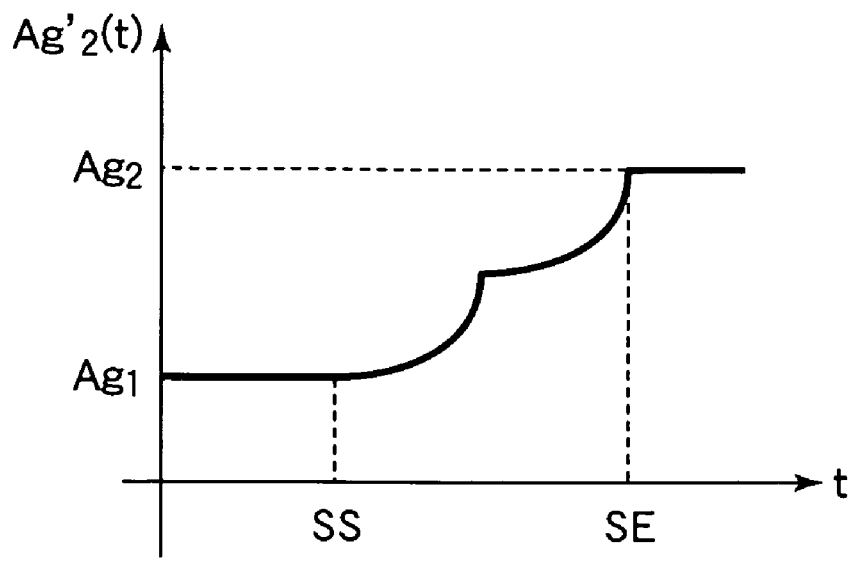
FIGS. 18A and 18B illustrate the smoothing of the gain coefficient by the gain coefficient nonlinear smoother in a variation of the third embodiment.
Figure 18B:
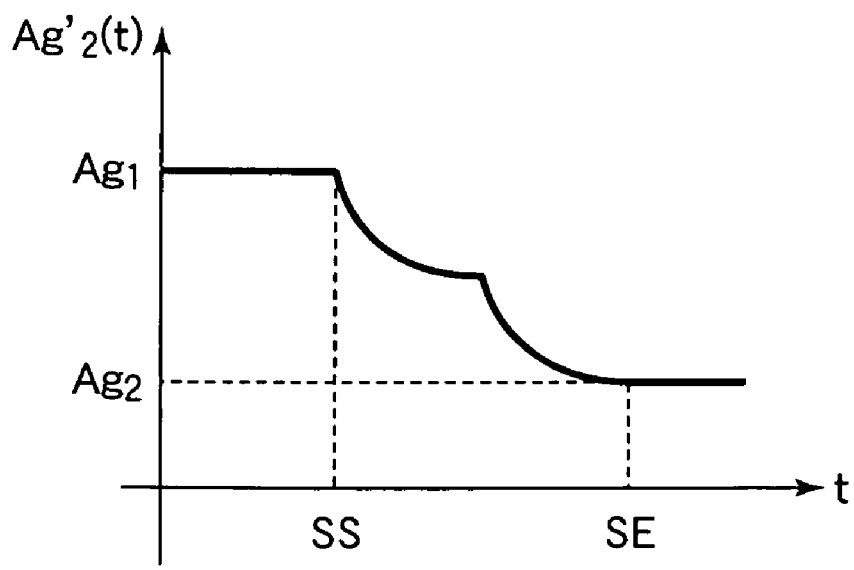
Figure 19A:
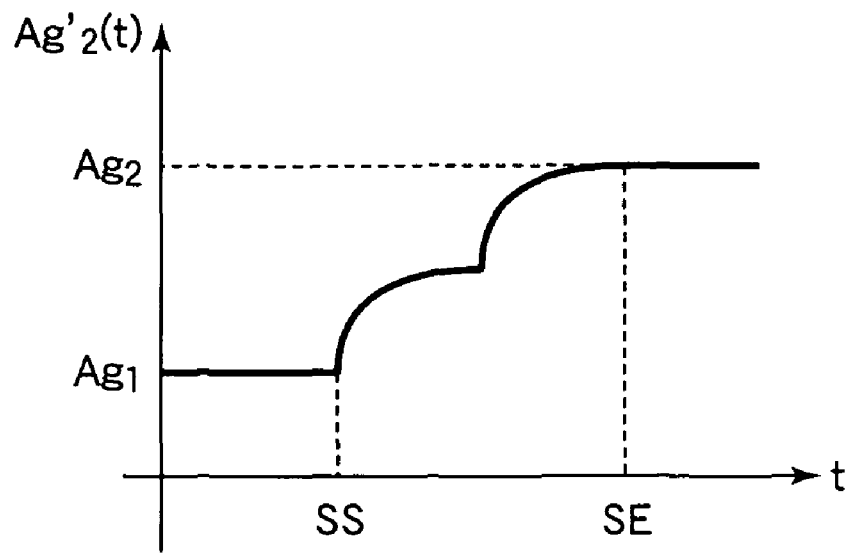
FIGS. 19A and 19B illustrate the smoothing of the gain coefficient by the gain coefficient nonlinear smoother in a variation of the third embodiment.
Figure 19B:
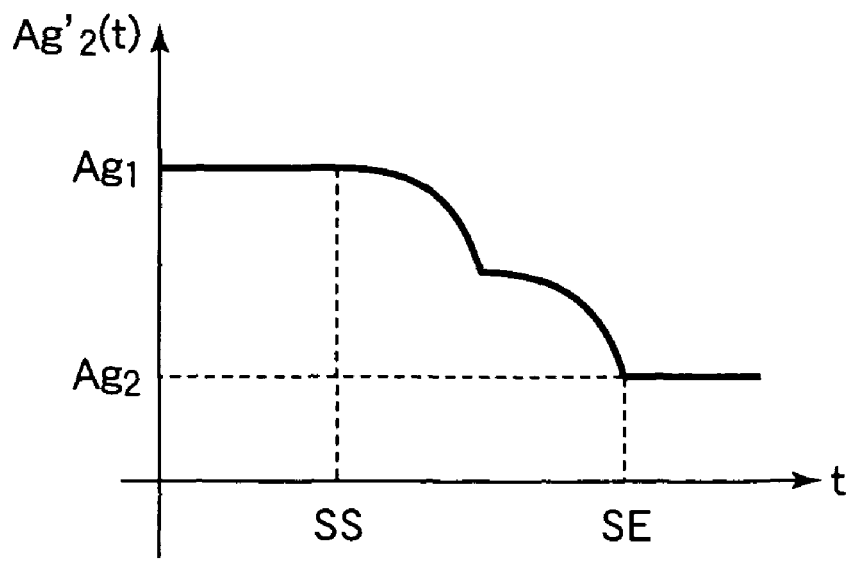
Figure 20A:
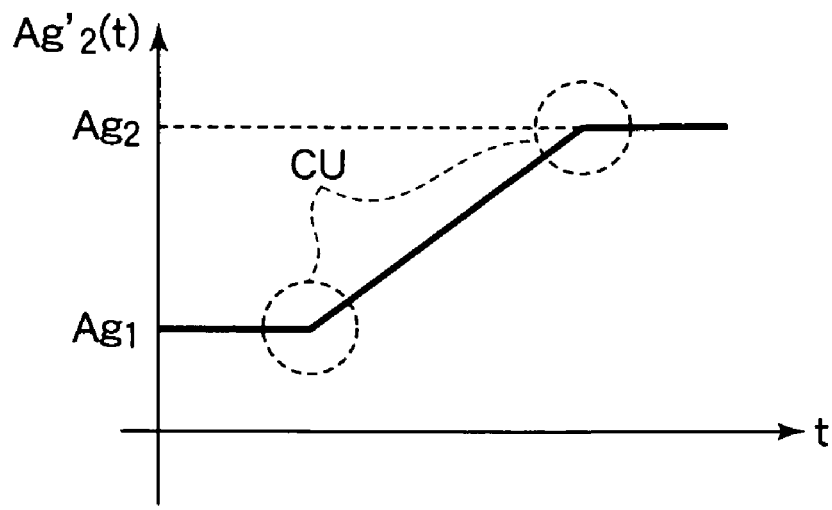
FIGS. 20A and 20B illustrate the appearance of cusps in the smoothing process performed by the gain coefficient linear smoother in the first embodiment.
Figure 20B:
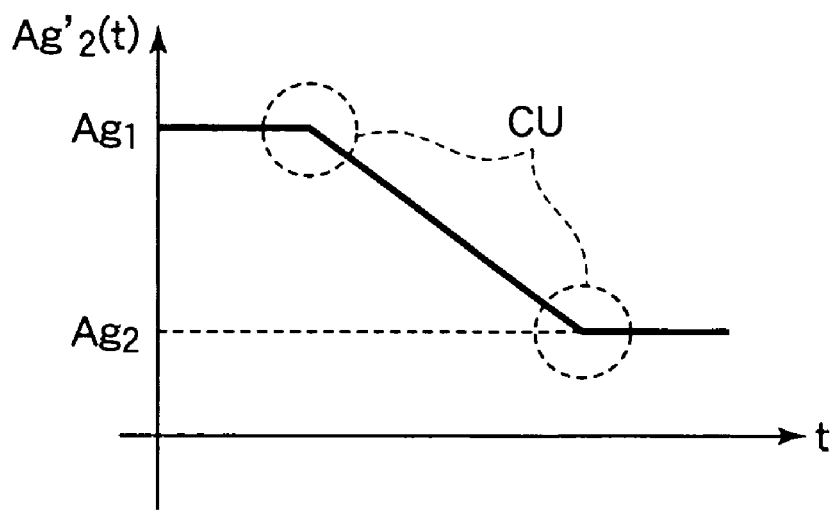
Figure 21A:
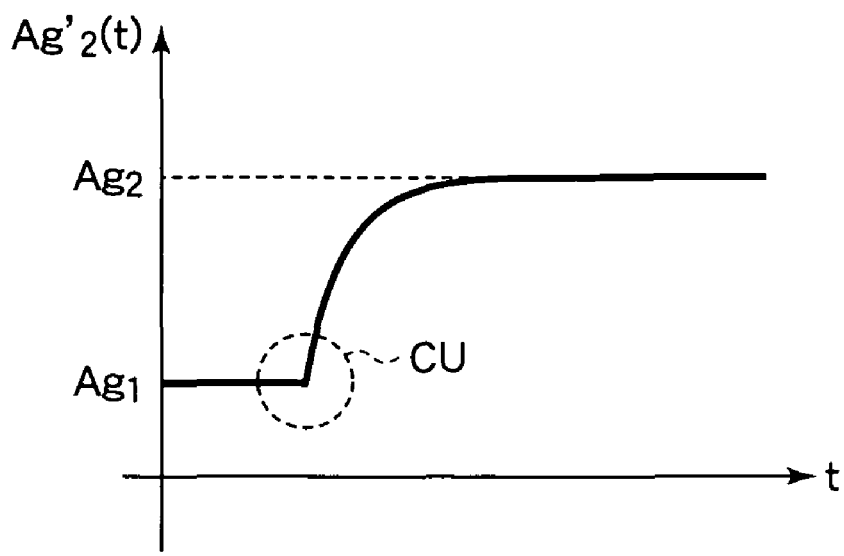
FIGS. 21A and 21B illustrate the appearance of cusps in the smoothing process performed by the gain coefficient nonlinear smoother in the second embodiment.
Figure 21B:
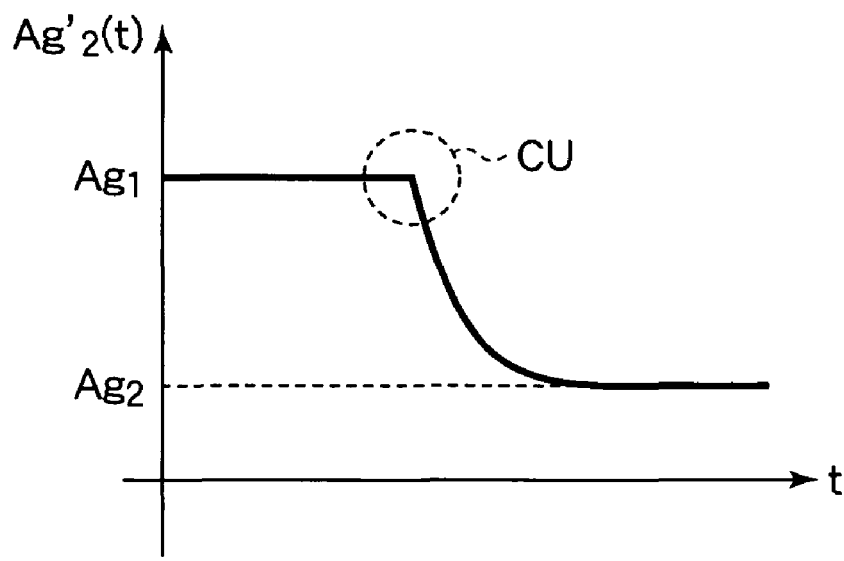
Figure 22A:
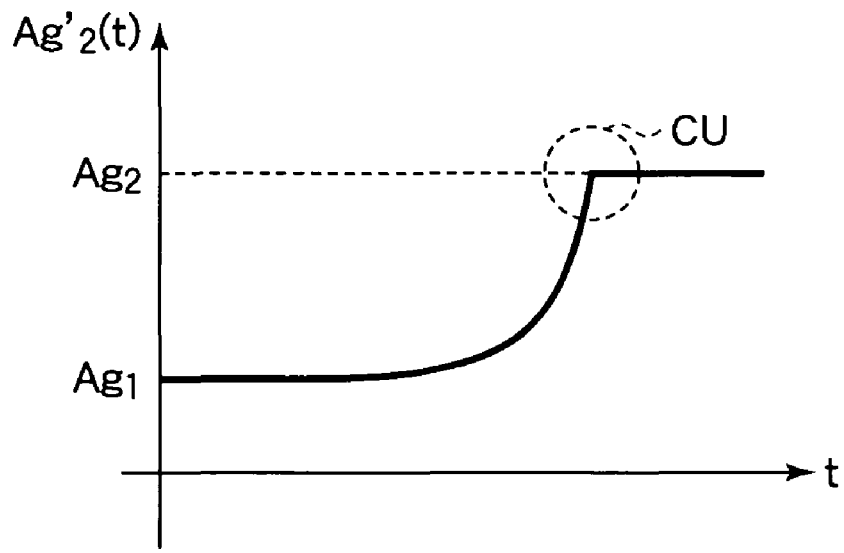
FIGS. 22A and 22B illustrate the appearance of cusps in the smoothing process performed by the gain coefficient nonlinear smoother in the third embodiment.
Figure 22B:
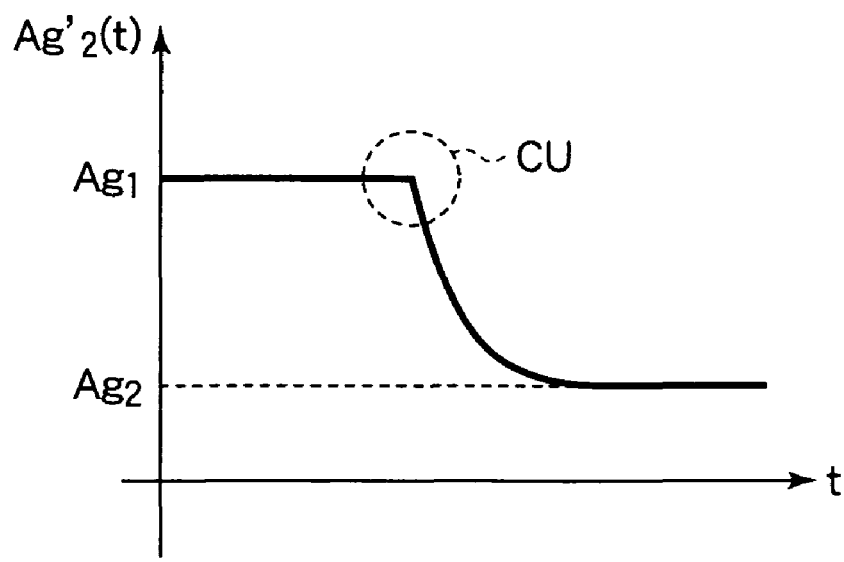
Figure 23A:
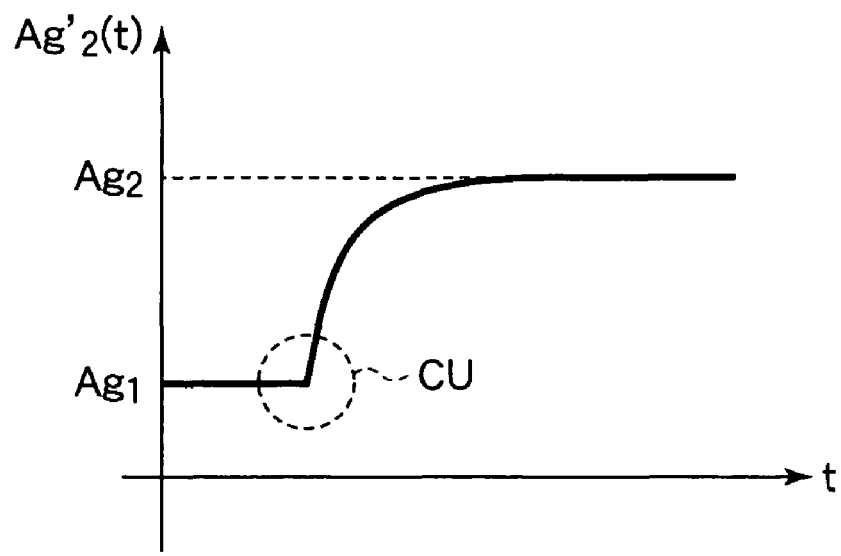
FIGS. 23A and 23B illustrate the appearance of cusps in the smoothing process performed by the gain coefficient nonlinear smoother in the third embodiment.
Figure 23B:
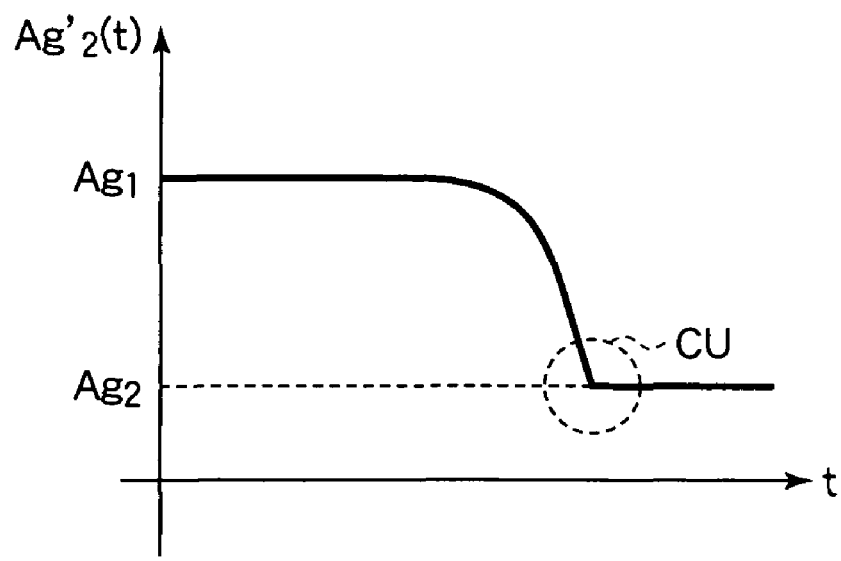

FIGS. 18A and 18B and FIGS. 19A and 19B illustrate the updating of a gain coefficient smoothed by using two nonlinear functions: FIGS. 18A and 18B illustrate cases in which two downwardly convex nonlinear functions are used; FIGS. 19A and 19B illustrate cases in which two upwardly convex nonlinear functions are used.

As described above, according to the third embodiment, the same effects as in the second embodiment can be obtained. In addition, according to the third embodiment, by using a method different from that used in the second embodiment, acoustically pleasing characteristics can be obtained and convergence to the target level becomes more precise and reliable.

(D) Fourth Embodiment

Next, an automatic gain control apparatus according to a fourth embodiment of the invention will be described with reference to the attached drawings.

The first to third embodiments have been described as smoothly altering the gain coefficient over an interval between the gain coefficient before and after an update by using a linear function or a nonlinear function. According to the smoothing processes in the first to third embodiments, however, as shown in FIGS. 20A and 20B, 21A and 21B, 22A and 22B, and 23A and 23B, cusps CU occur at, for example, the initiation and/or termination of the smoothing process, so strange acoustic sensations may be produced.

In the fourth embodiment, to mitigate the strange acoustic sensations caused by the cusps CU occurring in the smoothing process, a plurality of nonlinear smoothing processes are combined to smooth the gain coefficient before and after an update.

The structure of the fourth embodiment corresponds to the structure of the second embodiment shown in FIG. 8, so it will be described below with reference to FIG. 8. Since the function of the gain coefficient nonlinear smoother in the fourth embodiment differs from its function in the second and third embodiments, the operation of the gain coefficient nonlinear smoother will be described in detail below.

In FIG. 8, as in the third embodiment, the gain coefficient nonlinear smoother of the fourth embodiment changes the smoothing characteristic to a monotonic increase or decrease according to whether the gain coefficient increases or decreases and continues the smoothing process until a target gain coefficient is reached.

The gain coefficient nonlinear smoother of the fourth embodiment differs from the third embodiment in that two smoothing processes, one using an upwardly convex nonlinear function and one using a downwardly convex nonlinear function, are combined when smoothing is performed. This makes it possible to smooth the gain coefficient without generating cusps at the smoothing initiation and termination points.

Figure 24:
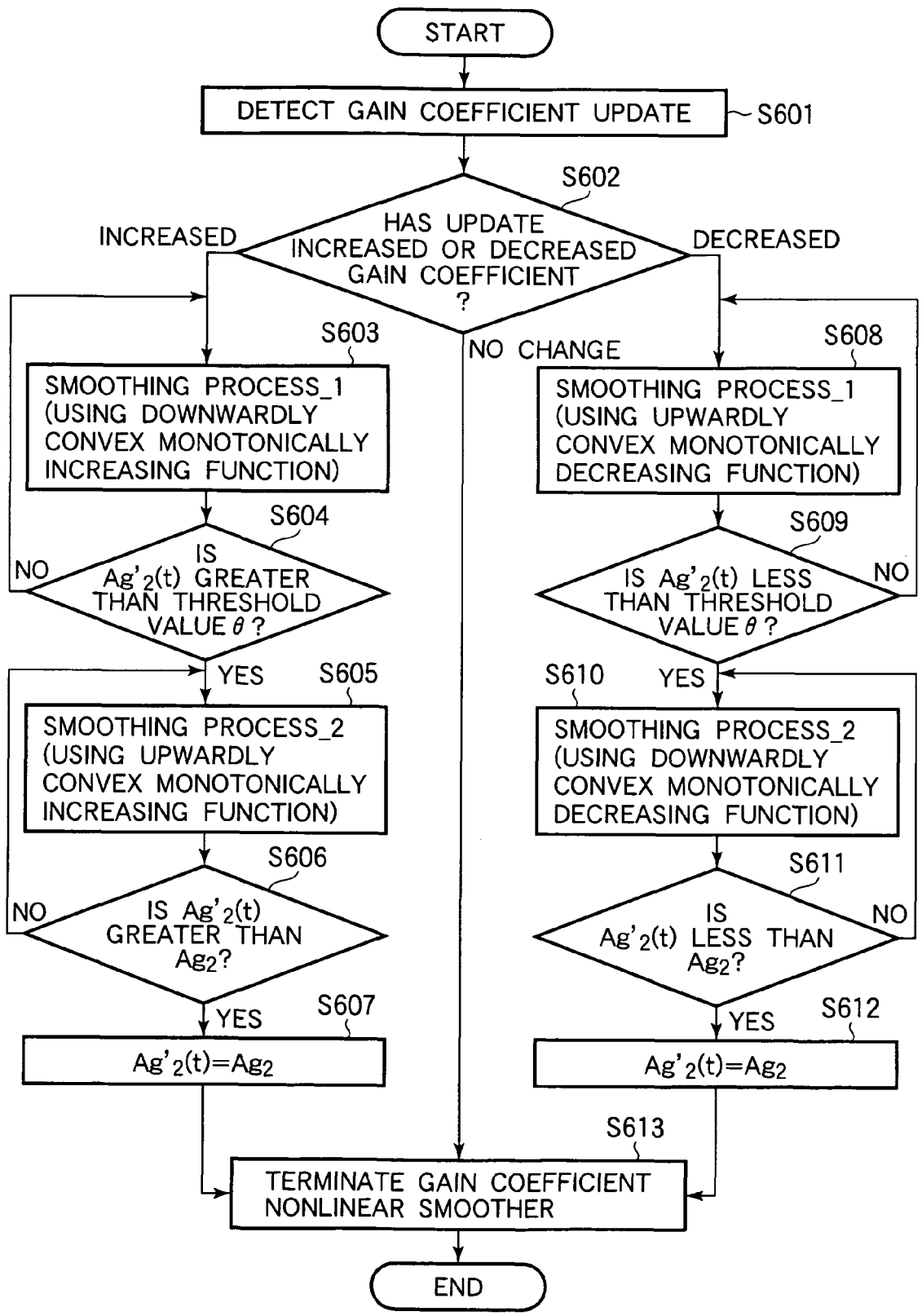
FIG. 24 is a flowchart illustrating the operation of the gain coefficient nonlinear smoother in a fourth embodiment of the invention.

FIG. 24 is a flowchart illustrating the operation of the gain coefficient nonlinear smoother according to the fourth embodiment.

In FIG. 24, as in the third embodiment, when the gain coefficient nonlinear smoother of the fourth embodiment detects an update of the gain coefficient by the gain coefficient generating circuit 3 (step S601), it decides whether the update has increased or decreased the gain coefficient (step S602). If the gain coefficient has increased, the flow proceeds to step S603; if the gain coefficient has decreased, the flow proceeds to step S608.

First, the operation performed when the update has increased the gain coefficient will be described. When the update has increased the gain coefficient, the gain coefficient nonlinear smoother first performs a smoothing process (on part $SM_D$ in FIG. 25) using a downwardly convex nonlinear function (step S603). This smoothing process performed by the gain coefficient nonlinear smoother, initially using a downwardly convex nonlinear function, makes it possible to avoid generating a cusp at the smoothing initiation.

Next, the gain coefficient nonlinear smoother makes a decision on changing the smoothing process (step S604). Specifically, the gain coefficient nonlinear smoother compares $Ag_2'(t)$ with a predetermined threshold value $\Theta$ (where $\Theta$ is any value satisfying $Ag_1 < \Theta < Ag_2$) and decides whether $Ag_2'(t)$ exceeds the threshold value $\Theta$ or not (step S604). If $Ag_2'(t)$ exceeds the threshold value $\Theta$, the flow proceeds to step S605; otherwise, the flow returns to step S603 and the smoothing process is continued.

Figure 25:
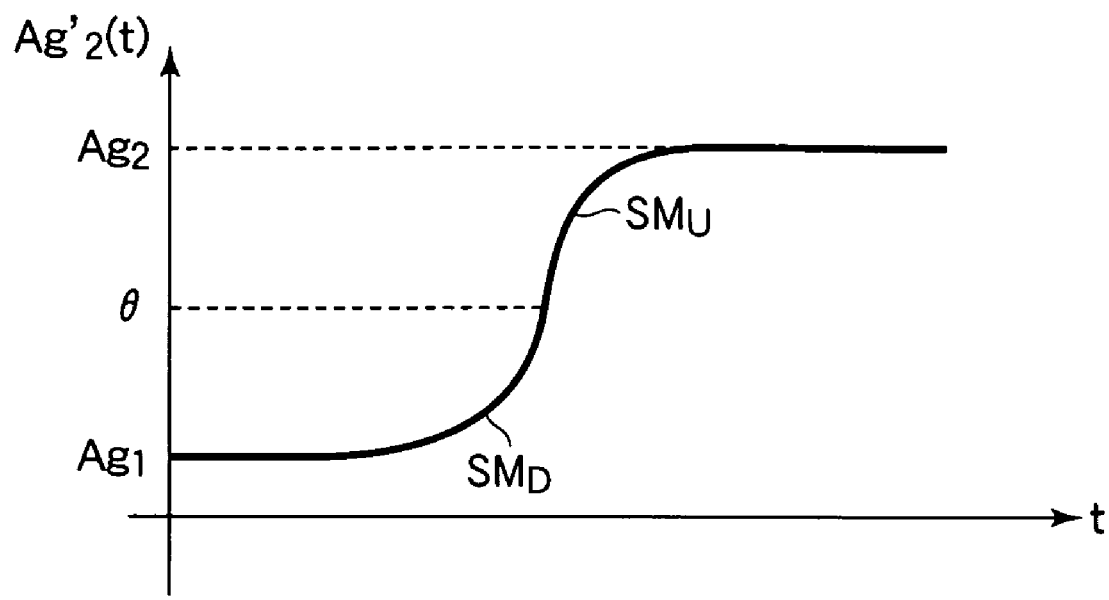
FIG. 25 illustrates the smoothing of the gain coefficient by the gain coefficient nonlinear smoother in the fourth embodiment.

FIG. 25 illustrates the smoothing of the gain coefficient in the fourth embodiment when the update has increased the gain coefficient. Although the threshold value $\Theta$ is not particularly limited and may be any value satisfying $Ag_1 < \Theta < Ag_2$ as described above, the average value of $Ag_1$ and $Ag_2$ is employed in the fourth embodiment as shown in FIG. 25.

If $Ag_2'(t)$ exceeds the threshold value $\Theta$ in step S604, the gain coefficient nonlinear smoother performs the smoothing process (on part $SM_U$ in FIG. 25), now using an upwardly convex nonlinear function (step S605). This smoothing process performed by the gain coefficient nonlinear smoother, using an upwardly convex nonlinear function, makes it possible to avoid generating a cusp at the termination of the smoothing process.

The gain coefficient nonlinear smoother then makes a decision on the termination of the smoothing process by comparing $Ag_2'(t)$ with $Ag_2$ as in the third embodiment. That is, if $Ag_2$ is greater than $Ag_2'(t)$, the gain coefficient nonlinear smoother passes $Ag_2'(t)$ to the multiplier 4 and continues the smoothing process. If $Ag_2$ is less than $Ag_2'(t)$, the gain coefficient nonlinear smoother sets the subsequent gain coefficient to $Ag_2$ (steps S606 and S607) and then terminates the smoothing process (step S613).

As shown in FIG. 25, the gain coefficient is updated according to a downwardly convex nonlinear function until it reaches the threshold value $\Theta$ and then, after having reached the threshold value $\Theta$, is updated according to an upwardly convex nonlinear function. This makes it possible to eliminate the generation of cusps occurring at the initiation and/or termination of the smoothing process and consequently eliminate strange acoustic sensations.

Next, the operation performed when the update has decreased the gain coefficient in step S602 will be described. When the update has decreased the gain coefficient, the gain coefficient nonlinear smoother first performs a smoothing process using an upwardly convex nonlinear function (step S608). This smoothing process performed by the gain coefficient nonlinear smoother, using a downwardly convex nonlinear function at first, makes it possible to avoid generating a cusp at the smoothing initiation.

Next, the gain coefficient nonlinear smoother makes a decision on changing the smoothing process (step S609). Specifically, the gain coefficient nonlinear smoother compares $Ag_2'(t)$ with a predetermined threshold value $\Theta$ (where $\Theta$ is any value satisfying $Ag_1 < \Theta < Ag_2$) and decides whether $Ag_2'(t)$ has fallen below the threshold value $\Theta$ or not (step S609). If $Ag_2'(t)$ has fallen below the threshold value $\Theta$, the flow proceeds to step S610; otherwise, the flow returns to step S608 and the smoothing process is continued.

Figure 26:
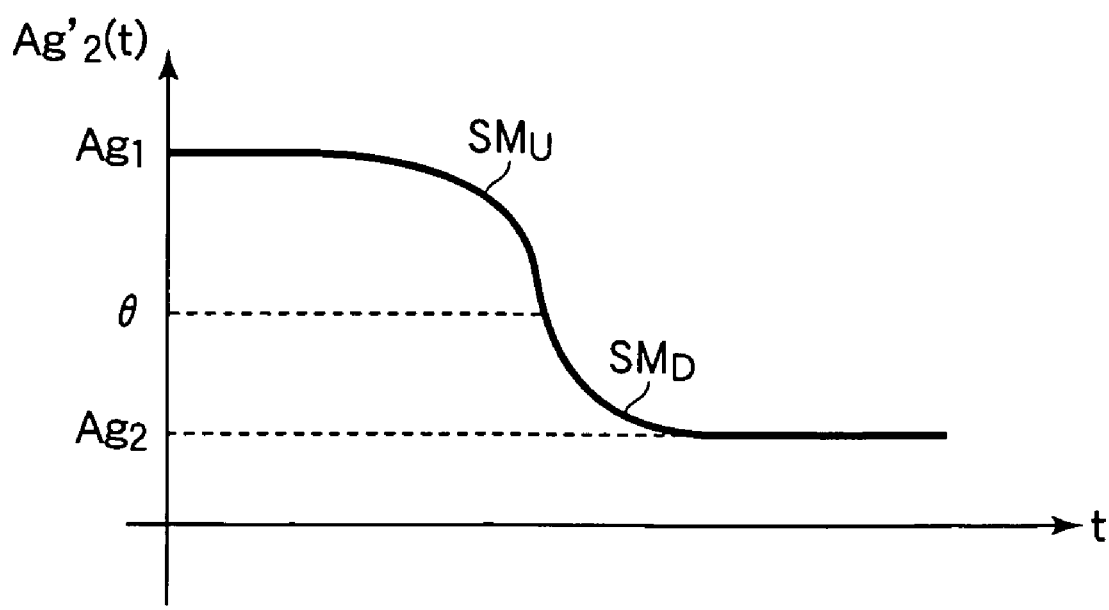
FIG. 26 illustrates the smoothing of the gain coefficient by the gain coefficient nonlinear smoother in the fourth embodiment.

FIG. 26 illustrates the smoothing of the gain coefficient in the fourth embodiment when the update has decreased the gain coefficient. Although the threshold value $\Theta$ is not particularly limited and may be any value satisfying $Ag_1 < \Theta < Ag_2$ as stated above, the average value of $Ag_1$ and $Ag_2$ is employed in the fourth embodiment as shown in FIG. 26.

If $Ag_2'(t)$ is below the threshold value $\Theta$ in step S609, the gain coefficient nonlinear smoother next performs a smoothing process using a downwardly convex nonlinear function (step S610). This smoothing process performed by the gain coefficient nonlinear smoother of the fourth embodiment, using a downwardly convex nonlinear function, makes it possible to avoid generating a cusp at the termination of the smoothing process.

The gain coefficient nonlinear smoother in the fourth embodiment then makes a decision on the termination of the smoothing process by comparing $Ag_2'(t)$ with $Ag_2$ as in the third embodiment. That is, if $Ag_2$ is less than $Ag_2'(t)$, the gain coefficient nonlinear smoother passes $Ag_2'(t)$ to the multiplier 4 and continues the smoothing process. If $Ag_2$ is greater than $Ag_2'(t)$, the gain coefficient nonlinear smoother sets the subsequent gain coefficient to $Ag_2$ (steps S611 and S612) and then terminates the smoothing process (step S613).

If it is decided in step S602 that the update has not changed the gain coefficient, the gain coefficient nonlinear smoother does not carry out the smoothing process (step S613).

In the fourth embodiment, use of a two-step nonlinear smoothing process has been assumed, but the nonlinear function used in the smoothing process is not limited to a two-step nonlinear function. Moreover, the smoothing method described in the second embodiment may be used in the smoothing in steps S605 and S610.

Although the fourth embodiment has been described as performing smoothing on the basis of the above equations (6) to (8), as in the third embodiment, a data table prepared in advance by the designer may be used instead, provided a predetermined smoothing characteristic can be obtained.

Figure 27A:
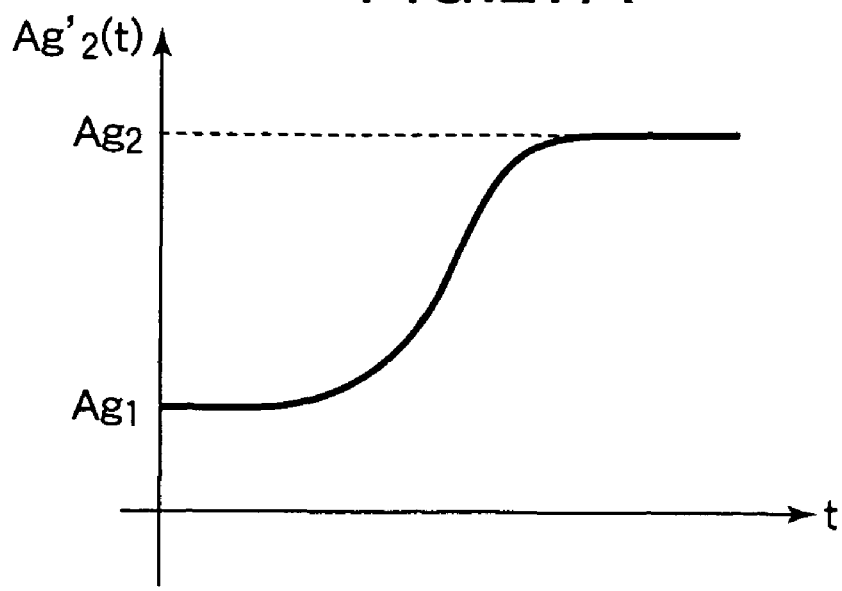
FIGS. 27A and 27B illustrate the smoothing of the gain coefficient by the gain coefficient nonlinear smoother in the fourth embodiment.
Figure 27B:
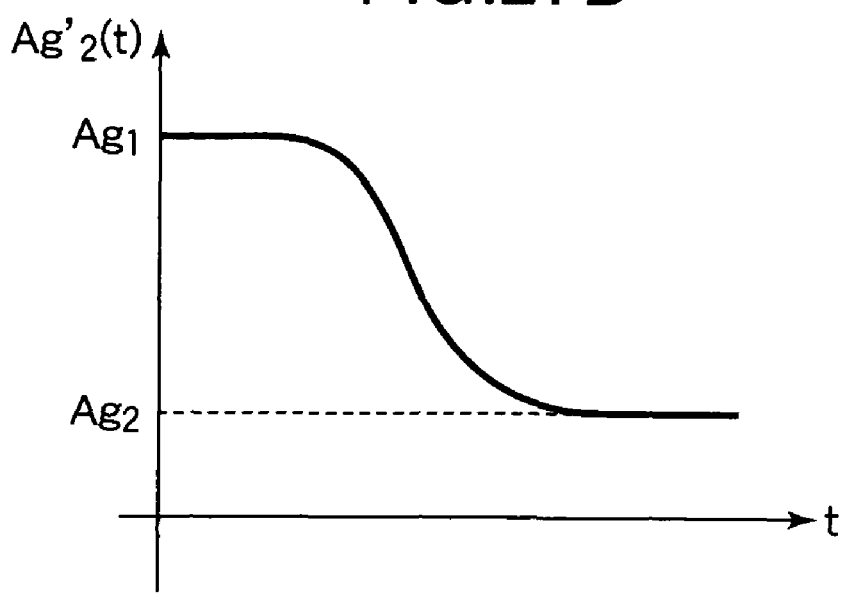

FIGS. 27A and 27B illustrate the smoothing of the gain coefficient by the gain coefficient nonlinear smoother 9 in the fourth embodiment. As shown in FIGS. 27A and 27B, the smoothing process in the fourth embodiment can be performed without generating the cusps that occurred in the smoothing processes in the first to third embodiments. As a result, communication quality can be improved.

(E) Fifth Embodiment

Next, an automatic gain control apparatus according to a fifth embodiment of the invention will be described with reference to the attached drawings.

In the first to fourth embodiments, the time taken for the smoothing operation (related to the interval length $\tau$ in the first embodiment, the time constant $\delta$ in the second embodiment, and the smoothing parameters $\xi$, $\alpha$, $\beta$ in the third and fourth embodiments) cannot be changed according to the gain coefficient difference before and after an update.

Because of this, when the gain coefficient difference before and after an update is small, since the smoothing process is carried out more slowly than necessary, attainment of the target level is delayed, and conversely, when the gain coefficient difference before and after the update is large, the smoothing process is carried out too quickly, so that strange acoustic sensations cannot be eliminated completely.

The fifth embodiment therefore permits the smoothing processing time to be altered according to the gain coefficient difference before and after an update.

Figure 28:
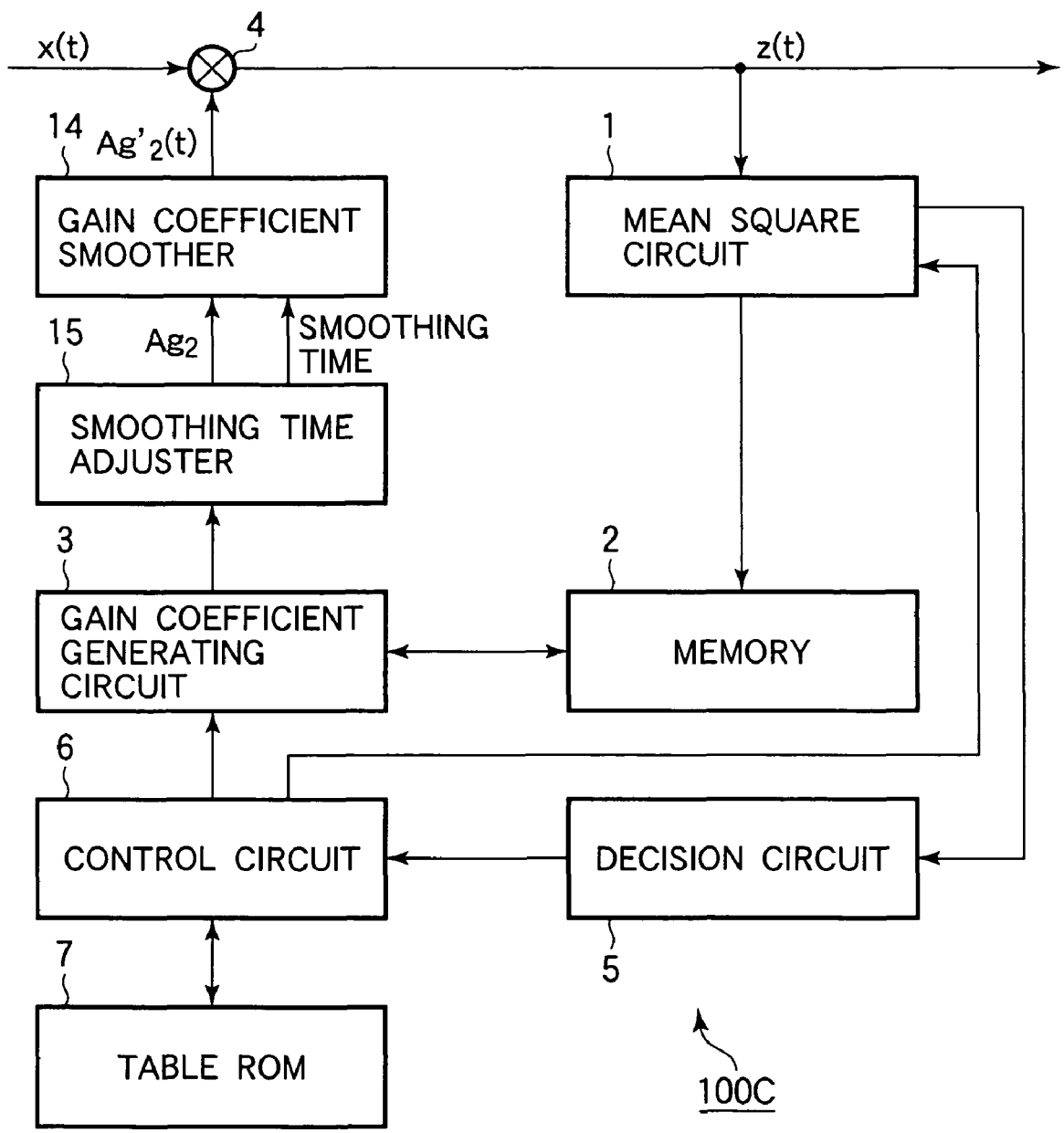
FIG. 28 is a block diagram showing the structure of an automatic gain control apparatus in a fifth embodiment of the invention.

FIG. 28 is a block diagram showing the structure of an automatic gain control apparatus 100C according to the fifth embodiment. As shown in FIG. 28, the automatic gain control apparatus 100C according to the fifth embodiment comprises a mean square circuit 1, a memory 2, a gain coefficient generating circuit 3, a multiplier 4, a decision circuit 5, a control circuit 6, a table ROM 7, a gain coefficient smoother 14, and a smoothing time adjuster 15.

The structure of the fifth embodiment differs from the structures of the first to fourth embodiments in that the fifth embodiment has a smoothing time adjuster 15, so only the structure and operation of the smoothing time adjuster 15 will be described here.

Either the gain coefficient linear smoother described in the first embodiment or one of the gain coefficient nonlinear smoothers described in the second to fourth embodiments can be employed as the gain coefficient smoother 14 in the fifth embodiment. Alternatively, a smoother having linear and nonlinear characteristics, including both the gain coefficient linear smoother in the first embodiment and one of the gain coefficient nonlinear smoothers in the second to fourth embodiments, may be employed as the gain coefficient smoother 14.

The smoothing time adjuster 15 determines the smoothing time according to the amount of change in the gain coefficient before and after an update calculated by the gain coefficient generating circuit 3, and supplies the determined smoothing time to the gain coefficient smoother 14.

Figure 29:
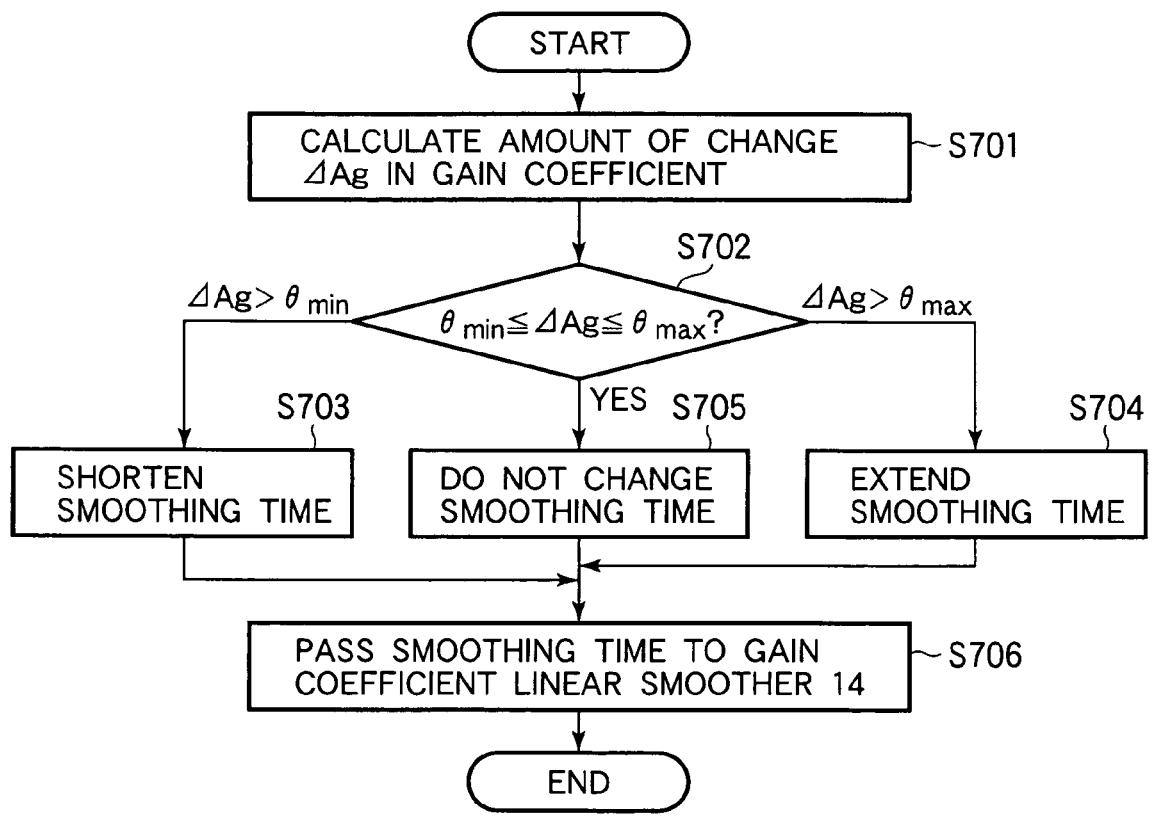
FIG. 29 is a flowchart illustrating the operation of the smoothing time adjuster in the fifth embodiment.

FIG. 29 is a flowchart illustrating the operation of the smoothing time adjuster 15.

As shown in FIG. 29, when the smoothing time adjuster 15 receives the gain coefficient calculated by the gain coefficient generating circuit 3, it calculates the amount of change $\Delta Ag$ in the gain coefficient on the basis of the gain coefficient $Ag_1$ before the update and the gain coefficient $Ag_2$ after the update (step S701).

Although the calculation of the amount of change $\Delta Ag$ in the gain coefficient is not limited to any specific method, if the gain coefficient Ag is scaled linearly, for example, the amount $\Delta Ag$ can be obtained by the following equation.

$$\Delta Ag = Ag_2 / Ag_1$$

When the gain coefficient Ag is scaled logarithmically, the amount $\Delta Ag$ may be obtained by the following equation.

$$\Delta Ag = Ag_2 - Ag_1$$

In the following description, it is assumed that the gain coefficient Ag is scaled linearly.

After the smoothing time adjuster 15 obtains the amount of change $\Delta Ag$ in the gain coefficient, it compares the amount of change $\Delta Ag$ in the gain coefficient with predetermined threshold values $\Theta_{max}$ and $\Theta_{min}$ (step S702) and adjusts the smoothing time according to the result of the comparison.

When the amount of change $\Delta Ag$ in the gain coefficient is less than the $\Theta_{min}$ threshold value, the smoothing time adjuster 15 shortens the predetermined smoothing time and supplies the shortened smoothing time to the gain coefficient smoother 14 (steps S703 and S706).

As described later, possible methods of shortening the smoothing time include decreasing the interval length $\tau$, when the gain coefficient linear smoother 8 in the first embodiment is employed as the gain coefficient smoother 14, and decreasing the time constant $\delta$, when the gain coefficient nonlinear smoother in the second embodiment is employed.

When the interval length τ, time constant δ, or another parameter is changed, it is changed to a predetermined interval length, time constant, or other parameter value.

When the amount of change ΔAg in the gain coefficient exceeds the $\Theta_{max}$ threshold value, the smoothing time adjuster 15 extends the predetermined smoothing time and supplies the extended smoothing time to the gain coefficient smoother 14 (steps S704 and S706).

As described later, possible methods of extending the smoothing time include increasing the interval length τ, when the gain coefficient linear smoother in the first embodiment is employed as the gain coefficient smoother 14, and increasing the time constant δ, when the gain coefficient nonlinear smoother in the second embodiment is employed.

When the amount of change ΔAg in the gain coefficient is greater than or equal to the $\Theta_{min}$ threshold value and less than or equal to the $\Theta_{max}$ threshold value ($\Theta_{min} \leq \Delta Ag \leq \Theta_{max}$) the smoothing time adjuster 15 does not change the predetermined smoothing time and supplies the unchanged smoothing time to the gain coefficient smoother 14 (steps S705 and S706).

The operation of the fifth embodiment will be described below using, as an example, an operation of adjusting the interval length τ described in the first embodiment and the time constant δ described in the second embodiment. The smoothing time can also be changed by an operation of adjusting the parameters ξ, α, β described in the third embodiment.

As an example, suppose that ΔAg=5.6, $\Theta_{max}$=3.1, $\Theta_{min}$=1.5, the interval length τ is one second (τ=1), and the time constant δ is 0.9.

In this case, since ΔAg>$\Theta_{max}$, the smoothing time adjuster 15 performs a process that extends the smoothing time. The altered value is a two-second interval length τ (τ=2); the time constant δ is 0.9 (δ=0.9). By this process, the time over which the gain coefficient is smoothed before and after the update can be extended so that the smoothing of the gain coefficient does not cause a strange acoustic sensation.

As another example, suppose that ΔAg=1.2, $\Theta_{max}$=3.1, $\Theta_{min}$=1.5, the interval length τ is one second (τ=1), and the time constant δ is 0.9.

In this case, since ΔAg<$\Theta_{min}$, the smoothing time adjuster 15 performs a process that shortens the smoothing time. The altered value is a half-second interval length τ (τ=0.5); the time constant δ is 0.9 (δ=0.9). By this process, the time over which the gain coefficient is smoothed before and after the update can be shortened so that the target level is reached quickly, without having the smoothing of the gain coefficient cause a strange acoustic sensation.

The numerical values used in the descriptions of the above operations are only examples and are not limiting.

As described above, according to the fifth embodiment, when the difference in the gain coefficient before and after an update is large, the smoothing time is extended to allow sufficient time for the process of smoothing the gain coefficient, thereby eliminating strange acoustic sensations.

Further, according to the fifth embodiment, when the difference in the gain coefficient before and after an update is small, the smoothing time is shortened and the process of smoothing the gain coefficient is performed quickly, enabling the target level to be reached quickly and eliminating strange acoustic sensations.

As a result, communication quality can be improved.

(F) Other Embodiments

Figure 30:
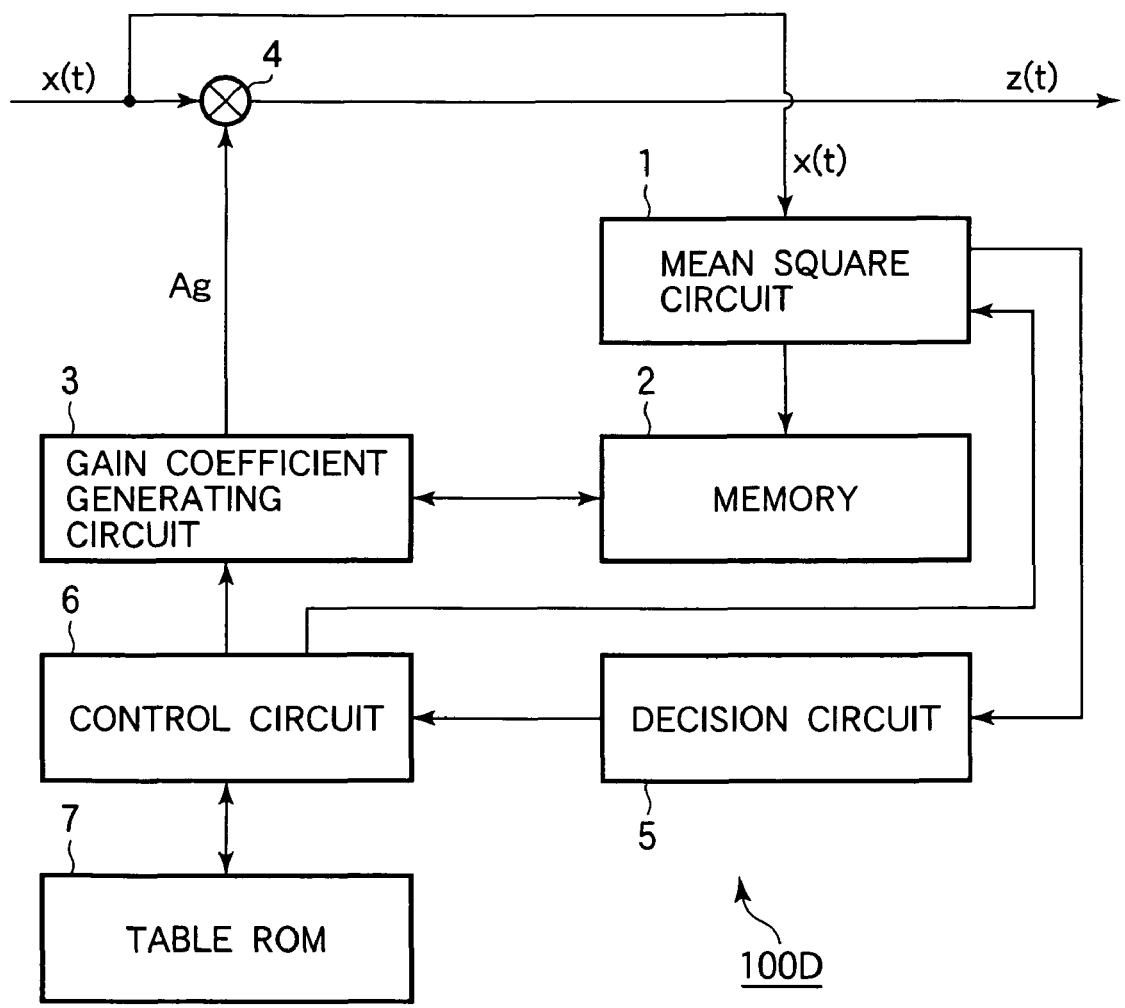
FIG. 30 is a block diagram illustrating the structure of an automatic gain control apparatus in another embodiment of the invention.

FIG. 30 is a block diagram showing another structure of the conventional automatic gain control apparatus shown in FIG. 2.

Figure 31:
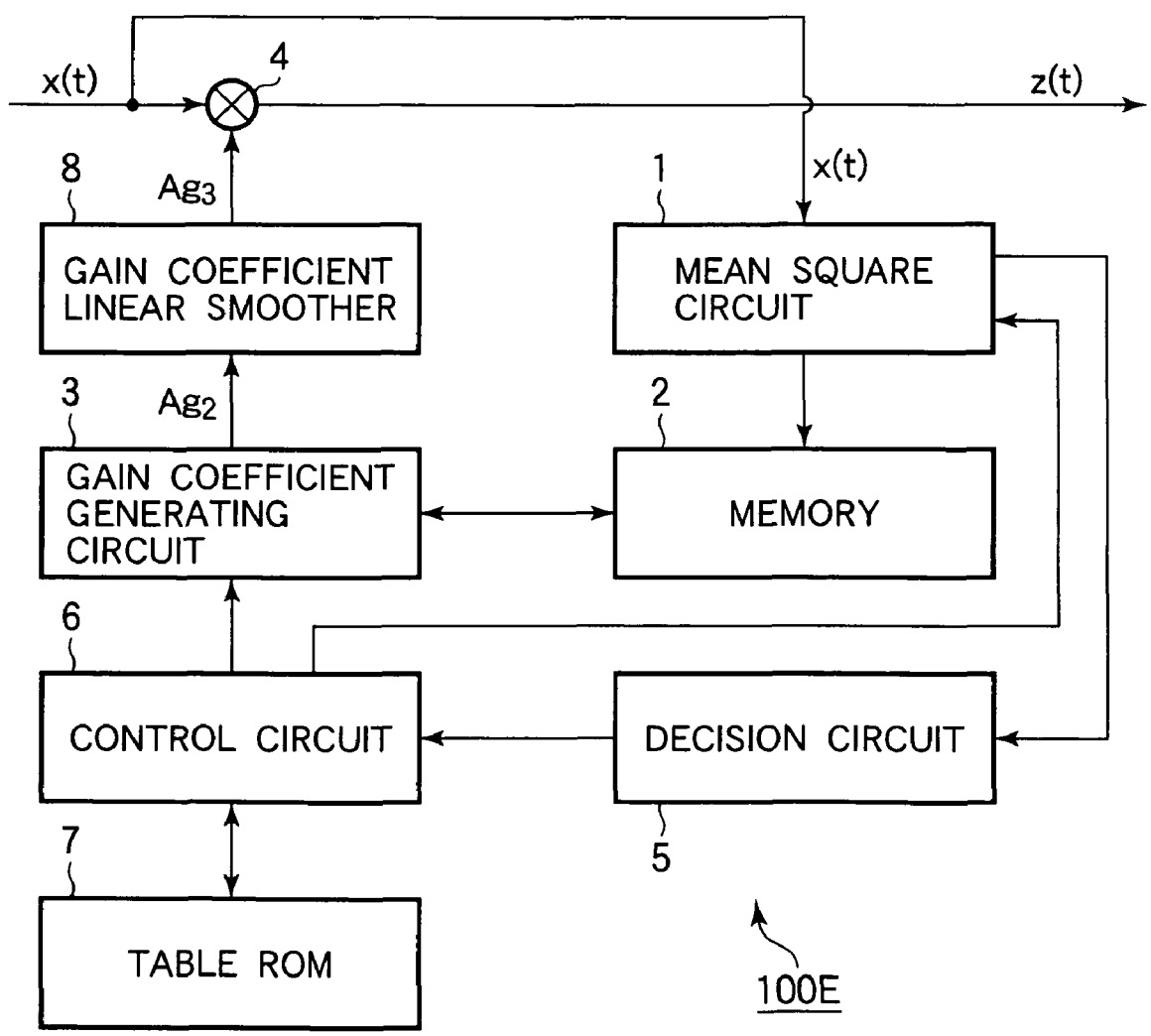
FIG. 31 is a block diagram illustrating the structure of an automatic gain control apparatus in another embodiment.
Figure 32:
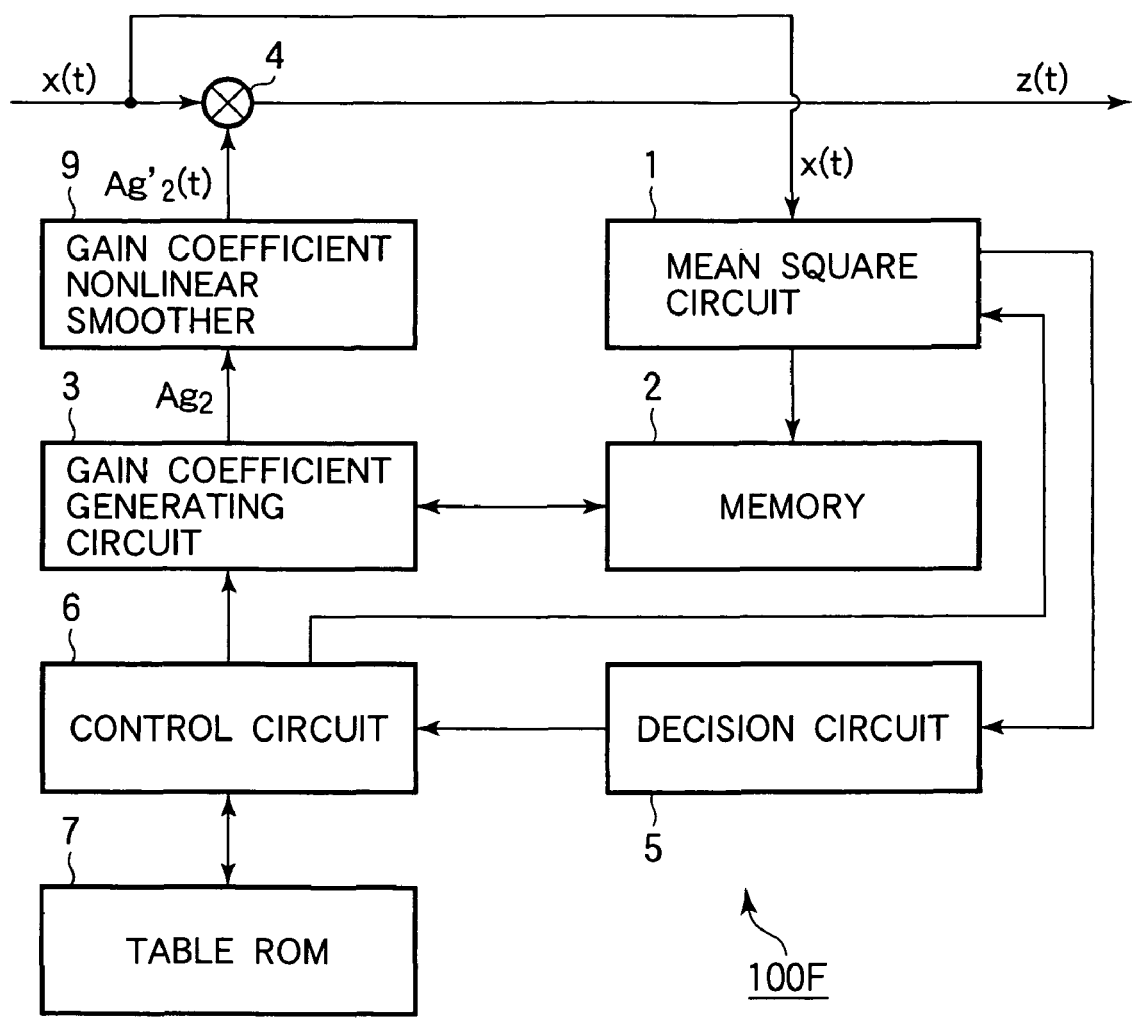
FIG. 32 is a block diagram illustrating the structure of an automatic gain control apparatus in another embodiment.
Figure 33:
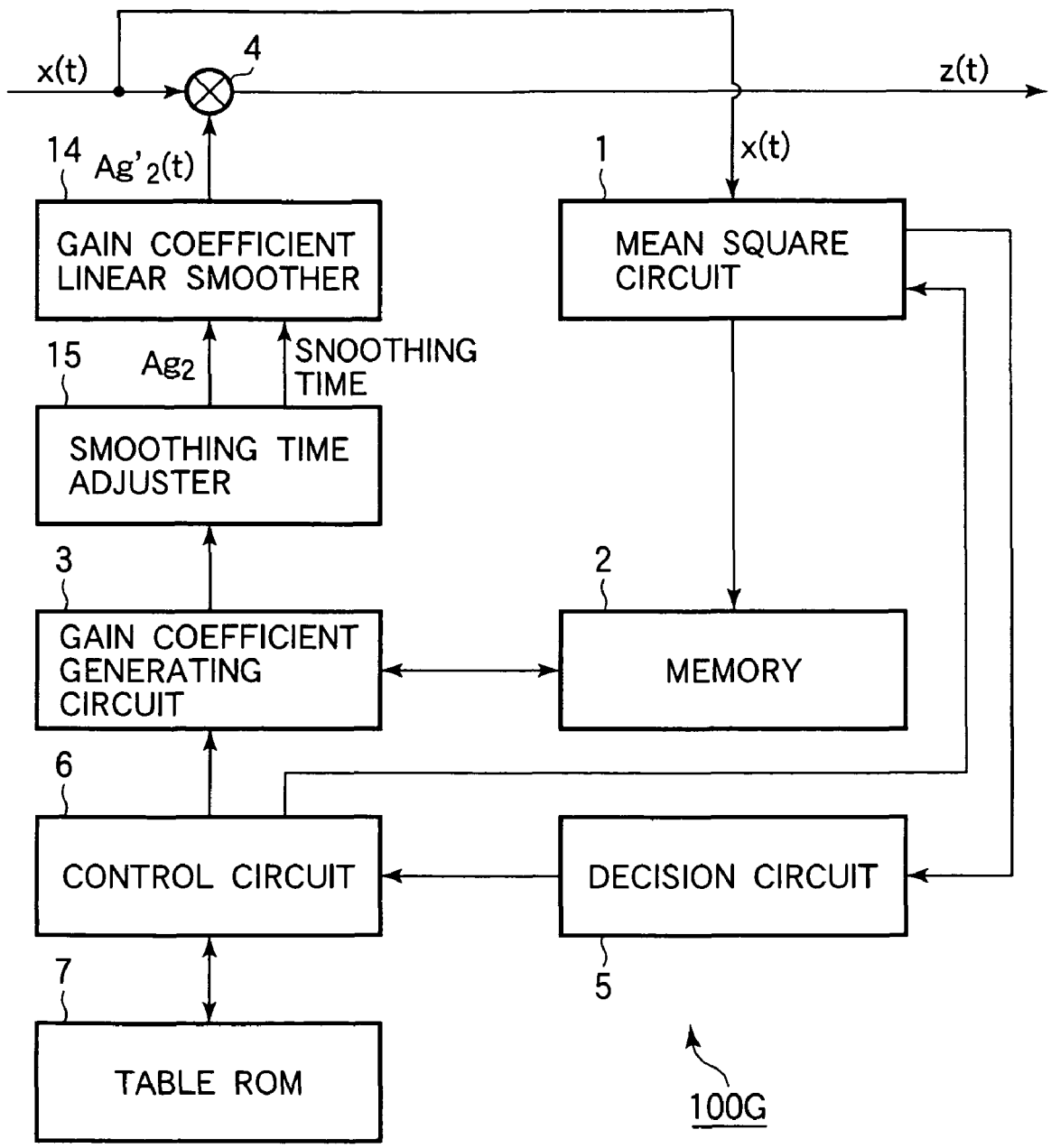
FIG. 33 is a block diagram illustrating the structure of an automatic gain control apparatus in another embodiment.

FIG. 31 is a block diagram showing a modified structure of the automatic gain control apparatus 100A in the first embodiment; FIG. 32 is a block diagram showing a modified structure of the automatic gain control apparatus in the second to fourth embodiments; FIG. 33 is a block diagram showing a modified structure of the automatic gain control apparatus 100C in the fifth embodiment.

In the conventional automatic gain control apparatus shown in FIG. 2 and the automatic gain control apparatus described in the first to fifth embodiments, the signal z(i) output from the multiplier 4 is input to the mean square circuit 1. In contrast, in a conventional automatic gain control apparatus 100D shown in FIG. 30 and automatic gain control apparatus 100E to 100G shown in FIGS. 31 to 33, a structure is employed in which the signal x(i) is input to the mean square circuit 1.

Even though the mean square circuit 1 receives the signal before it is multiplied by the gain coefficient, the obtainable effects are similar to the effects when the mean square circuit 1 receives the result multiplied by the gain coefficient in the multiplier 4.

Further, instead of calculating the mean square, the mean square circuit may also calculate, for example, the average of the absolute values of the input signal by using the following equation (9).

$$Ave(j) = \frac{\sum_{i=1}^{n}|z(i)|^2}{n} \quad (9)$$

What is claimed is:

1. An automatic gain control apparatus for providing a received signal with gain to control the signal level, comprising:

a mean square processing means for performing mean square processing on the received signal over prescribed sampling intervals;

a memory means for storing mean square values obtained by the mean square processing means;

a gain coefficient generating means for generating a gain coefficient by dividing a preset reference output level by a mean value of a predetermined number of the mean square values stored in the memory means, at predetermined generating intervals;

a decision means for deciding whether a received level of the received signal has changed;

a gain coefficient generation control means for, when a change in the received level of the received signal is detected by the decision means, determining the number of the mean square values to be used in the generating of the gain coefficient by the gain coefficient generating means, and the generating interval;

a gain coefficient alteration control means for altering the gain coefficient over an interval between the gain coefficient received from the gain coefficient generating means before an alteration and the gain coefficient received from the gain coefficient generating means after the alteration linearly and/or nonlinearly with a predetermined characteristic; and a multiplying means for multiplying the received signal by the gain coefficient received from the gain coefficient alteration control means; wherein if expressed by a graph in a coordinate system in which time is indicated on a horizontal axis and the gain coefficient is indicated on a vertical axis, the nonlinear characteristic of the gain coefficient alteration control means is a combination of an upwardly convex nonlinear function and a downwardly convex nonlinear function, when the gain coefficient received from the gain coefficient generating means after the alteration increases from the gain coefficient received from the gain coefficient generating means before the alteration, the gain coefficient alteration control means changes the downwardly convex nonlinear function to the upwardly convex nonlinear function during the interval between the gain coefficient received from the gain coefficient generating means before an alteration and the gain coefficient received from the gain coefficient generating means after the alteration, and when the gain coefficient received from the gain coefficient generating means after the alteration decreases from the gain coefficient received from the gain coefficient generating means before the alteration, the gain coefficient alteration control means changes the upwardly convex nonlinear function to the downwardly convex nonlinear function during the interval between the gain coefficient received from the gain coefficient generating means before an alteration and the gain coefficient received from the gain coefficient generating means after the alteration.

2. The automatic gain control apparatus of claim 1, further comprising a time adjustment means for adjusting a time taken for updating of the gain coefficient by the gain coefficient alteration control means according to an amount of change between the gain coefficient received before the change and the gain coefficient after the change.

* * * * *